US012032046B2

United States Patent
Hatano et al.

(10) Patent No.: US 12,032,046 B2
(45) Date of Patent: Jul. 9, 2024

(54) SENSOR FOR MEASURING MAGNETIC FIELD BY UTILIZING PRINCIPLE OF OPTICALLY DETECTED MAGNETIC RESONANCE (ODMR)

(71) Applicant: TOKYO INSTITUTE OF TECHNOLOGY, Tokyo (JP)

(72) Inventors: Yuji Hatano, Tokyo (JP); Takayuki Iwasaki, Tokyo (JP); Mutsuko Hatano, Tokyo (JP); Jaewon Shin, Susono (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 65 days.

(21) Appl. No.: 18/146,984

(22) Filed: Dec. 27, 2022

(65) Prior Publication Data
US 2023/0204696 A1 Jun. 29, 2023

(30) Foreign Application Priority Data
Dec. 28, 2021 (JP) .................................. 2021-213800

(51) Int. Cl.
*G01R 33/32* (2006.01)
(52) U.S. Cl.
CPC .................................. *G01R 33/323* (2013.01)
(58) Field of Classification Search
CPC .............................. G01R 33/323; G01R 33/26
See application file for complete search history.

(56) References Cited

U.S. PATENT DOCUMENTS

| 2013/0300404 A1* | 11/2013 | Hebiguchi | G01R 33/07 324/225 |
| 2020/0057117 A1* | 2/2020 | Nishibayashi | G01R 33/0017 |
| 2023/0184853 A1* | 6/2023 | Yoshii | G01R 33/26 324/301 |

FOREIGN PATENT DOCUMENTS

JP 5544502 B2 7/2014

OTHER PUBLICATIONS

Yuta Masuyama et al., "Gradiometer Using Separated Diamond Quantum Magnetometers", Sensors 2021, 21, 977. https://doi.org/10.3390/s21030977, 11 pages.

* cited by examiner

*Primary Examiner* — Jay Patidar
(74) *Attorney, Agent, or Firm* — Studebaker & Brackett PC

(57) ABSTRACT

A sensor includes two magnetic sensors detecting a magnetic field around an object, and outputting at least one of a magnetic field signal and a temperature signal, an optical system emitting the excitation light to the two magnetic sensors, and a processor calculating a difference between a magnetic fields corresponding to the magnetic field signal detected by the two magnetic sensors, wherein each of the magnetic sensors includes an element disposed around the object and having color centers, an antenna radiating a microwave magnetic field to the element, an optical sensor detecting an intensity of a fluorescence generated by the element, and outputting an intensity signal, and a controller calculating at least one of a magnetic field and temperature around the measurement object, and output at least one of a magnetic field signal indicating the calculated magnetic field and a temperature signal indicating the calculated temperature to the processor.

12 Claims, 16 Drawing Sheets

※1 The repeating frequency is FM1 (cycle = 1/FM1).
※2 The repeating frequency is twice longer than FM1 (cycle = (1/FM1)/2).
※3 $F_{AL}$ is a microwave frequency for a signal output from the first microwave oscillator 11.
※4 $F_{AH}$ is a microwave frequency for a signal output from the second microvave oscillator 12.

SENSOR FOR MEASURING MAGNETIC FIELD BY UTILIZING PRINCIPLE OF OPTICALLY DETECTED MAGNETIC RESONANCE (ODMR)

CROSS-REFERENCE TO RELATED APPLICATION

This application is based upon and claims the benefit of priority of the prior Japanese Patent Application No. 2021-213800, filed on Dec. 28, 2021, the entire contents of which are incorporated herein by reference.

FIELD

The present disclosure relates to a sensor.

BACKGROUND

A magnetic sensor is known for measuring a magnetic field by utilizing a principle of Optically Detected Magnetic Resonance (ODMR) using diamond elements having NV centers (for example, see "Gradiometer Using Separated Diamond Quantum Magnetometers" Yuta Masuyama, Katsumi Suzuki, Akira Hekizono, Mitsuyasu Iwanami, Mutsuko Hatano, Takayuki Iwasaki, Takeshi Ohshima, et al. Sensors 2021, 21, 977. https://doi.org/10,3390/s21030977, hereafter referred to as "Non-Patent Document 1"). In a magnetic sensor described in Non-Patent Document 1, a pair of diamond elements are disposed close to each other, the difference between magnetic fields detected by the pair of diamond elements is calculated in order to eliminate an effect of an external magnetic field.

Further, it is known that a pair of magnetic sensors such as a pair of Hall elements are disposed across a measurement object, and a difference between magnetic fields detected by the pair of magnetic sensors is calculated in order to eliminate the effect of an external magnetic field (e.g., see Japanese Patent No. 5544502, hereafter referred to as "Patent Document 1)".

SUMMARY

In the magnetic sensors described in Non-Patent Document 1, if characteristics of the pair of diamond elements are different, it is not easy to eliminate external magnetic fields by the above calculation. Therefore, the characteristics of the pair of diamond elements should be as uniform as possible.

Further, when the magnetic sensors described in Patent Document 1 are used as current sensors for measuring a current flowing through a bus bar connected to a battery in an electric vehicle, since a temperature difference between both sides of the bus bar occurs due to a large current flowing through the bus bar, magnetic fields detected by the pair of magnetic sensors is affected according to temperature characteristics of the magnetic sensors. Therefore, unless magnetic sensors having stable temperature characteristics are used, it is not easy to eliminate an external magnetic field by the above calculation, and therefore the magnetic sensors is affected according to temperature characteristics of the magnetic sensors.

In order to overcome the above problems, an object of the present disclosure is to provide a sensor capable of detecting magnetic fields with high precision by reducing effect on elements having color centers and suppressing effects of external magnetic fields.

A sensor according to the present invention includes a first magnetic sensor configured to detect a magnetic field around a measurement objec when excitation light is emitted, and outputting at least one of a first magnetic field signal indicating the detected magnetic field and a first temperature signal indicating a temperature around the measurement object, a second magnetic sensor configured to detect a magnetic field around a measurement object when excitation light is emitted, and outputting at least one of a second magnetic field signal indicating the detected magnetic field and a second temperature signal indicating a temperature around the measurement objec, an optical system configured to emitting the excitation light to the first and second magnetic sensors, and a processor configured to calculating a difference between the magnetic field corresponding to the first magnetic field signal and the magnetic field corresponding to the second magnetic field signal, wherein each of the first and second magnetic sensors includes an element disposed around the measurement object and having color centers, an antenna configured to radiate a microwave magnetic field to the element, an optical sensor configured to detect an intensity of a fluorescence generated by the element, and outputting an intensity signal indicating the detected intensity, and a controller configured to generate a microwave output to the antenna based on the intensity signal, calculating at least one of a magnetic field and temperature around the measurement object, and output at least one of a magnetic field signal indicating the calculated magnetic field and a temperature signal indicating the calculated temperature to the processor.

According to the present disclosure, a sensor may be provided for detecting a magnetic field with high precision by reducing effect on elements having color centers and suppressing effects of external magnetic field.

DESCRIPTION OF EMBODIMENTS

Hereinafter, the present disclosure will be explained along preferred embodiments. The present invention is not limited to the below explained embodiments, and may be appropriately changed without deviating from a scope of the present invention. Further, in the below explained embodiments, some partial configurations are omitted in descriptions and diagrams, and known or well-known techniques are appropriately applied to the omitted configurations, when there are no contradictions between the below explained embodiments and the applied techniques.

Figure 1:
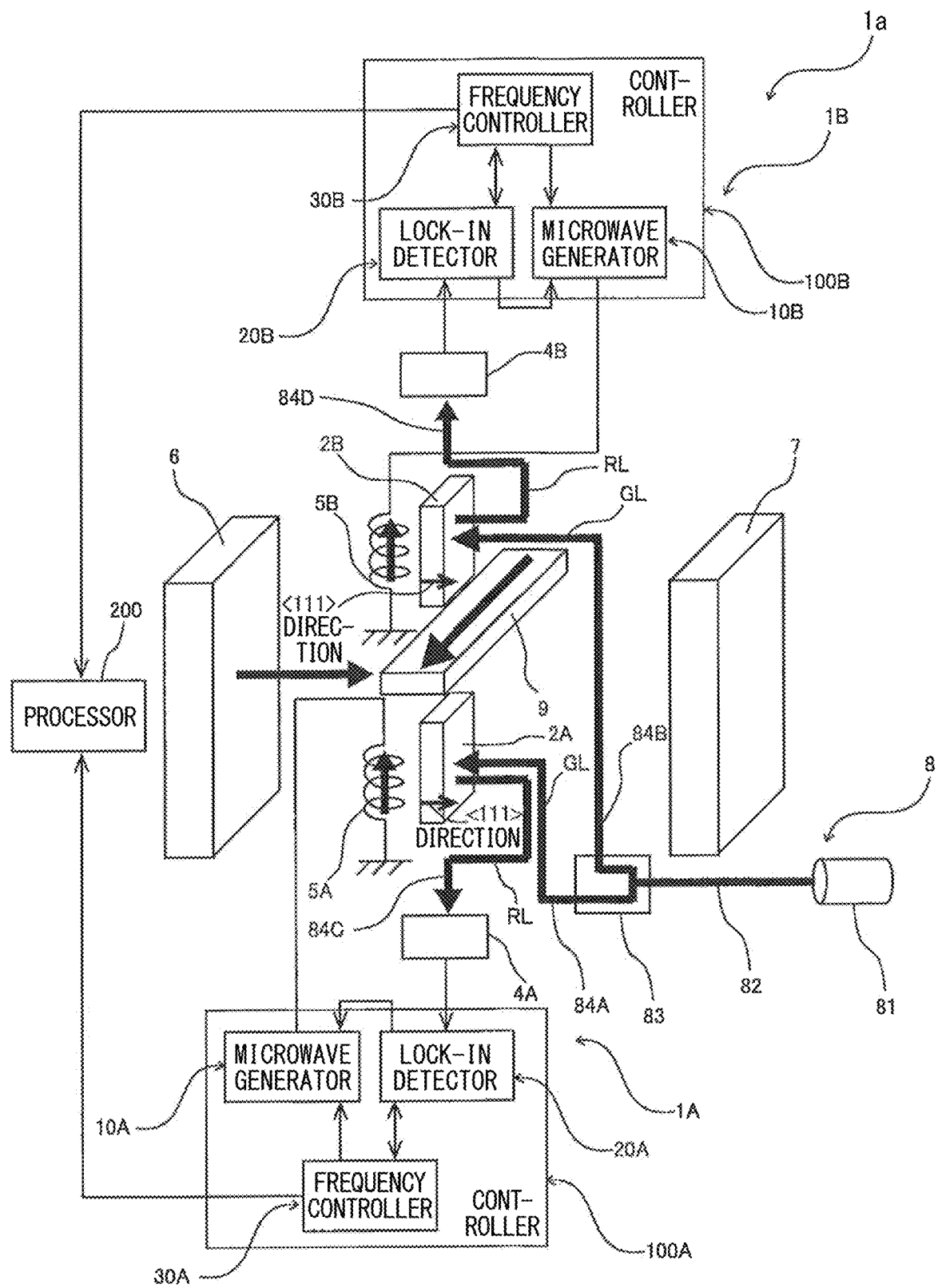
FIG. 1 is a diagram illustrating a sensor according to a first embodiment of the present disclosure.

FIG. 1 is a diagram illustrating a sensor 1a according to a first embodiment of the present disclosure. The sensor 1a measures a currents flowing through a bus bar 9 and temperatures around the bus bar 9 connected to a battery in an electric vehicle. The sensor 1a includes a first magnetic sensor 1A, a second magnetic sensor 1B, a first magnet 6, a second magnet 7, an optical system 8 and a processor 200. The first magnetic sensor 1A detects a magnetic field around the bus bar 9, when excitation light is emitted from the optical system 8, and the first magnetic sensor 1A outputs at least one of a first magnetic field signal indicating the detected magnetic field and a first temperature signal indicating a temperature around the bus bar 9. The second magnetic sensor 1B detects a magnetic field around the bus bar 9, when excitation light is emitted from the optical system 8, and the second magnetic sensor 1B outputs at least one of a second magnetic field signal indicating the detected magnetic field and a second temperature signal indicating a temperature around the bus bar 9. The first and second magnets 6 and 7 is a pair of magnets applying a static magnetic field around the first and second magnetic sensors 1A and 1B. The optical system 8 emits the excitation light to the first and second magnetic sensors 1A. The bus bar 9 is a measurement object such as a current line, around which a magnetic field is generated, and the generated magnetic field is detected by the sensor 1a. The processor 200 calculates a difference between a magnetic field corresponding to the first magnetic field signal and a magnetic field corresponding to the second magnetic field signal, when the first and second magnetic field signals are input to the processor 200.

The first magnetic sensor 1A includes a diamond element 2A, an optical sensor 4A, an antenna 5A and a controller 100A. The diamond element 2A has NV centers, and is disposed close to one surface of the bus bar 9 (the lower surface in FIG. 1). The optical system 8 radiates green light GL as excitation light to the diamond element 2A. The optical sensor 4A detects an intensity of a fluorescence generated by electronic spin resonances in NV centers and outputs an intensity signal indicating the detected intensity. The antenna 5A radiates a frequency variable microwave magnetic field to the diamond element 2A. The controller 100A includes a microwave generator 10A, a lock-in detector 20A and a frequency controller 30A. The controller 100A generates a microwave output to the antenna 5A based on the intensity signal input from the optical sensor 4A, calculates at least one of a magnetic field and temperature around the bus bar 9, and output at least one of a magnetic field signal indicating the calculated magnetic field and a temperature signal indicating the calculated temperature to the processor 200. The microwave generator 10A supplies microwaves to the antenna 5A. The functions of the lock-in detector 20A and frequency controller 30A will be explained later.

The second magnetic sensor 1B includes a diamond element 2B, an optical sensor 4B, an antenna 5B and a controller 100B. The diamond element 2B has NV centers, and is disposed close to the other surface of the bus bar 9 (the upper surface in FIG. 1). The optical system 8 radiates green light GL as excitation light to the diamond element 2B. The optical sensor 4B detects an intensity of a fluorescence generated by electronic spin resonances in NV centers and outputs an intensity signal indicating the detected intensity. The antenna 5B radiates a frequency variable microwave magnetic field to the diamond element 2B. The controller 100B includes a microwave generator 10B, a lock-in detector 20B and a frequency controller 30B. The controller 100B generates a microwave output to the antenna 5B based on the intensity signal input from the optical sensor 4B. The microwave generator 10B supplies microwaves to the antenna 5B. The functions of the lock-in detecting element 20B is similar to that of the lock-in detecting element 20A explained later, and the functions of the frequency controller 30B is similar to that of the frequency controller 30A explained later.

The diamond element 2A in the first magnetic sensor 1A and diamond element 2B in the second magnetic sensor 1B are formed as a rectangle plate, and disposed so as to face each other across the bus bar 9 in the thickness direction thereof. Further, a distance between the diamond element 2A and the lower surface of the bus bar 9 is equal to a distance between the diamond element 2B and the upper surface thereof. Further, the NV axes extending to <111> directions in the diamond elements 2A and 2B are parallel to the surface of the bus bar 9, and are disposed in a direction perpendicular to a current direction in the bus bar 9. Further, the NV axes extending to the <111> directions in the diamond elements 2A and 2B are disposed parallel to each other, and are parallel to magnetic field $B_I$ generated by a current flowing through the bus bar 9. In the present embodiment, the thickness directions in the diamond elements 2A and 2B are defined as the <111> directions, it is assumed that orientations of diamond crystals in the diamond elements 2A and 2B are aligned in the <111> directions.

The antenna 5A in the first magnetic sensor 1A is a coil and etc., is disposed so as to face the diamond element 2A, and radiates microwave magnetic fields in a direction perpendicular to the NV axes extending to the <111> direction in the diamond element 2A. The antenna 5B in the second magnetic sensor 1B is a coil and etc., is disposed so as to face the diamond element 2B, and radiates microwave magnetic fields in a direction perpendicular to the NV axes extending to the <111> direction in the diamond element 2B.

The first and second magnets 6 and 7 are disposed so as to face each other across the bus bar 9 in a width direction thereof (in a direction parallel to the <111> direction). Further, the first and second magnets 6 and 7 are disposed so as to face each other across the diamond elements 2A and 2B in the <111> direction, and apply a static magnetic field parallel to the NV axes extending to the <111> directions in the diamond elements 2A and 2B.

The optical system 8 includes a light source 81, an optical fiber 82, a demultiplexer 83 and a pair of optical fibers 84A and 84B. The light source 81 is a laser, and emits a laser beam having a wavelength range from 500 nm to 560 nm as an excitation light. The optical fiber 82 guides a laser beam from the light source 81 to the demultiplexer 83. The demultiplexer 83 branches a laser beam guided by the optical fiber 82. The diamond element 2A in the first magnetic sensor 1A is attached at one end of the optical fiber 84A, and the optical fiber 84A guides a laser beam from the demultiplexer 83 to the diamond element 2A. Further, the diamond element 2B in the second magnetic sensor 1B is attached at the other end of the optical fibers 84A, and the optical fiber 84B guides a laser beam from the demultiplexer 83 to the diamond element 2B. The pair of optical fibers 84A and 84B is a pair of light guiding paths guiding the excitation light to each of the diamond elements 2A and 2B in the first and second magnetic sensor 1A and 1B.

Each of the optical sensor 4A in the first magnetic sensor 1A and the optical sensor 4B in the second magnetic sensor 1B is a photodiode. The optical sensor 4A in the first magnetic sensor 1A is attached to one end of an optical fiber 84C branched from the optical fiber 84A via a dichroic mirror (not shown). The branched optical fiber 84C guides a red fluorescence RL (explained later) emitted from the diamond element 2A to the optical sensor 4A. Further, the optical sensor 4B in the second magnetic sensor 1B is attached to one end of an optical fiber 84D branched from the optical fiber 84B via a dichroic mirror (not shown). The branched optical fiber 84D guides a red fluorescence RL (explained later) emitted from the diamond element 2B to the optical sensor 4B. The light sensor 4A may be disposed proximity to the diamond element 2A, and receive the red fluorescence RL emitted from the diamond element 2A, instead of guiding the red fluorescence RL from the diamond element 2A to the optical sensor 4A via the optical fiber 84A, the dichroic mirror and the optical fiber 84C. Similar to the light sensor 4A, the light sensor 4B may be disposed proximity to the diamond element 2B, and receive the red fluorescence RL emitted from the diamond element 2B, instead of guiding the red fluorescence RL from the diamond element 2B to the optical sensor 4B via the optical fiber 84B, the dichroic mirror and the optical fiber 84D.

The first magnetic sensor 1A in the sensor 1a measures a magnetic field $B_A$ and temperature TA and etc., around the bus bar 9 in accordance with a principle of ODMR, by radiating green light GL to the NV centers in the diamond element 2A, radiating microwave magnetic fields to the NV centers in the diamond element 2A, and performing frequency modulation with respect to the microwave magnetic fields. Similar to the diamond element 2A, the second magnetic sensor 1B measures a magnetic field $B_B$ and temperature TB and etc., around the bus bar 9 in accordance with the principle of ODMR, by radiating green light GL to the NV centers in the diamond element 2B, radiating microwave magnetic fields to the NV centers in the diamond element 2B, and performing frequency modulation with respect to the microwave magnetic fields.

A magnetic field $B_A$ detected by the first magnetic sensor 1A is represented by the following equation (1), and a magnetic field $B_B$ detected by the second magnetic sensor 1B is represented by the following equation (2). Magnetic fields in a direction parallel to surfaces of the bus bar 9 and perpendicular to a direction of a current flowing through the bus bar 9 are reflected to the magnetic fields $B_A$ and $B_B$ represented by equations (1) and (2).

$$B_A = B_I + B_O \quad (1)$$

$$B_B = -B_I + B_O \quad (2)$$

$B_I$ is a magnetic field generated by a current flowing through the bus bar 9, and $B_O$ is an external magnetic field.

The external magnetic field $B_O$ may be eliminated by calculating the difference between the magnetic fields $B_A$ and $B_B$ represented by the above equations (1) and (2). In the sensor 1a, the processor 200 calculates a difference between the magnetic field $B_A$ detected by the first magnetic sensor 1A and the magnetic field $B_B$ detected by the second magnetic sensor 1B to eliminate the external magnetic field $B_O$ in order to calculate the magnetic field $B_I$ represented by the following equation (3).

$$B_I = (\text{magnetic field } B_A - \text{magnetic field } B_B)/2 \quad (3)$$

Figure 2:
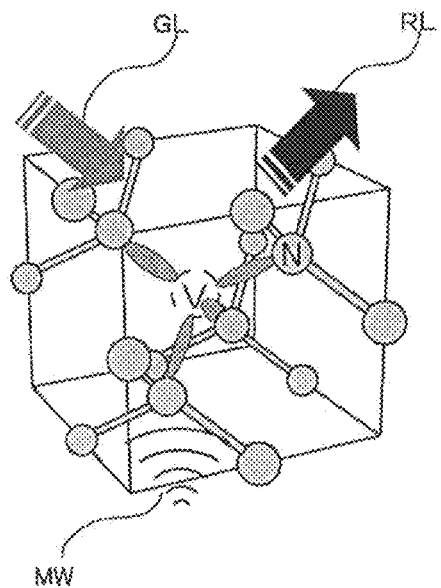
FIG. 2 is a diagram illustrating a structure of a diamond element having NV centers.

FIG. 2 is a diagram illustrating a structure of a diamond element having a NV centers. As shown in FIG. 2, the NV centers is a complex impurity defect consisting of a pair of nitrogen N entering a substitution position of carbon in a diamond lattice and a vacancy V which is a carbon removing portion adjacent to the nitrogen. The NV center forms electron spin triplet states of magnetic quantum number ms=−1, 0, +1, when the NV center becomes a NV− from a neutral charge state NV0, by trapping one electron. A diamond quantum sensor measures magnetic fields, temperatures, and etc., by using the electron spin triplet states.

Figure 3:
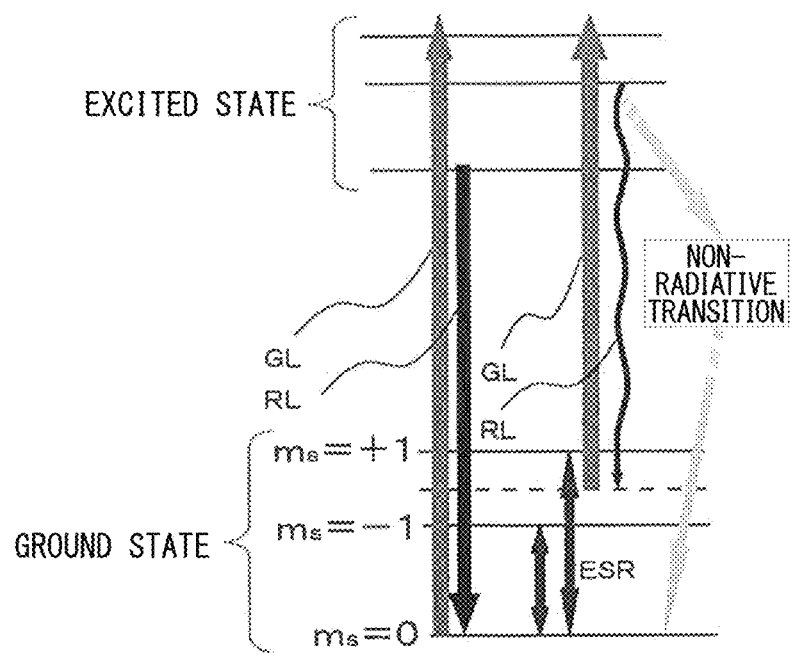
FIG. 3 is a diagram illustrating a principle of a diamond quantum sensor including diamond elements having NV centers and measuring magnetic fields by utilizing a principle of ODMR.

FIG. 3 is a diagram illustrating principles of a diamond quantum sensor including diamond elements having NV centers and measuring a magnetic field by utilizing the principle of ODMR. As shown in FIGS. 2 and 3, the NV center emits a red fluorescence RL when green light GL radiated thereto as excitation light. The intensity (brightness) of the red fluorescence RL is high when the NV centers are excited from a ground state (a state of a magnetic quantum number of the electron spin ms=d0), whereas the intensity is low when the NV centers are excited from a level causing an electron spin resonance (a state of a magnetic quantum number of the electron spin ms=±1).

When the magnitude of the magnetic field is 0, and a microwave magnetic field MW of a resonant frequency (about 2.87 GHz) is radiated to the NV centers, the level of the NV center transitions to a level (ms=±1) in which the NV centers produce an electron spin resonance (ESR). A part of the electrons excited from the level returns to the ground state through a non-radiative transition, and does not contribute to the emission. Therefore, when NV centers are excited from a level that produce the electron spin resonance, the intensity of the red fluorescence RL decreases. In the present embodiment, a magnetic field is always present around the diamond elements 2A and 2B, by applying a static magnetic field around the diamond elements 2A and 2B by the first and second magnets 6 and 7 (see FIG. 1).

Figure 4:
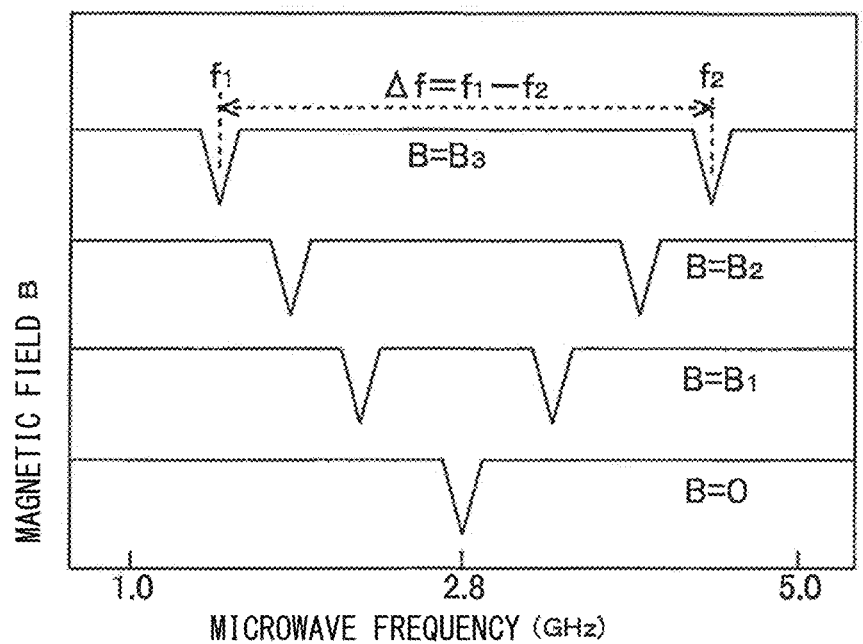
FIG. 4 is a graph illustrating relationships between peak frequencies in an ODMR spectrum and magnetic fields.

FIG. 4 is a graph illustrating relationships between peak frequencies in an ODMR spectrum and a magnetic field B. As shown in FIG. 4, when a magnetic field B is 0, there is only one peak in the ODMR spectrum, and when the magnetic field B is a value greater than 0, i.e., $B_1$, $B_2$ or $B_3$ ($B_3 > B_2 > B_1 > 0$), there are two peaks in the ODMR spectrum. A frequency split $\Delta f$ ($=f_1-f_2$) in microwaves corresponding to the two peaks in the ODMR spectrum increases in proportion to the magnitude of the magnetic field B.

Figure 5:
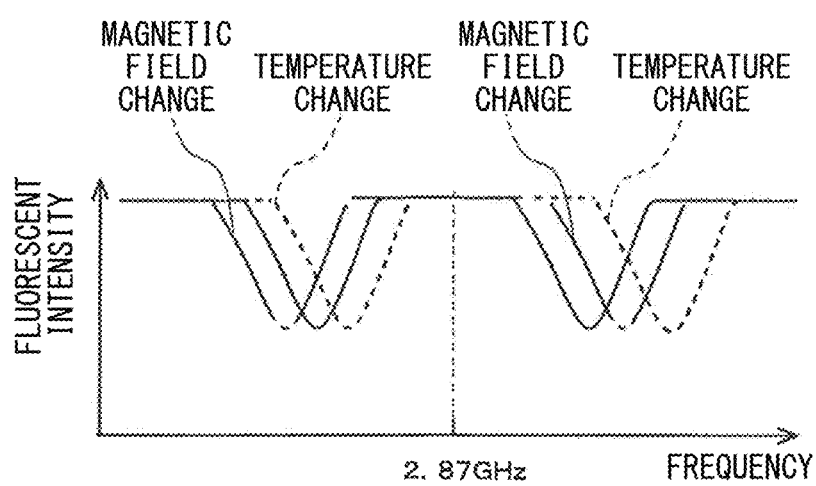
FIG. 5 is a graph illustrating the relationship among two peak frequencies in an ODMR spectrum, magnetic fields and temperatures.

FIG. 5 is a graph illustrating relationships among frequencies of two peaks in an ODMR spectrum, a magnetic field and a temperature. As shown in FIG. 5, two peaks in the ODMR spectrum are similarly moved in accordance with a temperature change in a measurement object. When one peak in an ODMR spectrum is moved to low frequency side in accordance with a temperature change in the measurement object, the other peak in the ODMR spectrum is moved to low frequency side by the same frequency width as that of the one peak. On the other hand, when one peak in an ODMR spectrum is moved to high frequency side in accordance with a temperature change in the measurement object, the other peak in the ODMR spectrum is moved to high frequency side by the same frequency width as that of the one peak. Therefore, the media frequency between the two peaks in the ODMR spectrum is moved by a temperature change in the measurement object.

The sensor 1a according to the first embodiment may be used as a battery sensor for measuring a battery remaining amount in an electric vehicle. The battery remaining amount in the electric vehicle is calculated based on a value integrating currents flowing through the bus bar 9 (see FIG. 1) in a battery. Thus, it is required to improve the measurement accuracy of the battery remaining amount based on the integrated current value, by increasing a response speed to changes in a current flowing through the bus bar 9 in the battery to improve the measurement accuracy of the current for each time. Further, it is required to measure a leakage current of a minute amount with high accuracy, when an electric vehicle stops, and to measure a current with high accuracy in response to changes in a current of several hundred amperes, when an electric vehicle rapidly accelerates or decelerates. In order to correspond to such requests, in the sensor 1a according to the first embodiment, the controller 100A in the first magnetic sensor 1A includes the microwave generator 10A, the lock-in detecting element 20A and the frequency controller 30A, as explained later. Similar to the controller 100A, a controller 100B in the second magnetic sensor 1B includes the microwave generator 10B, the lock-in detecting element 20B and the frequency controller 30B, as explained later.

Figure 6:
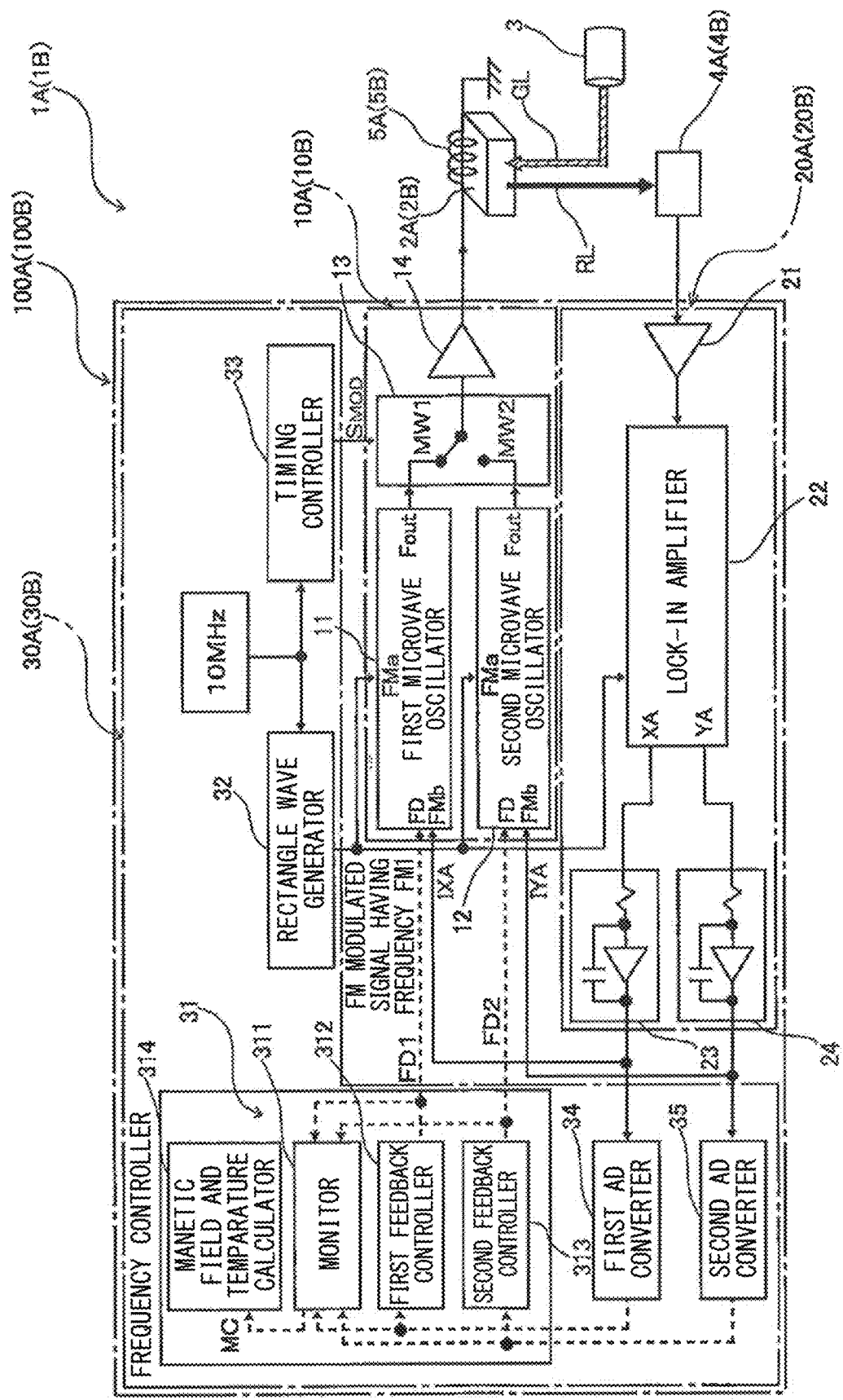
FIG. 6 is a circuit diagram illustrating first and second magnetic sensors.

FIG. 6 is a circuit diagram illustrating the first and second magnetic sensors 1A and 1B. The second magnetic sensor 1B has the same configuration as that of the first magnetic sensor 1A. Therefore, the first magnetic sensor 1A will be explained, and explanations for the first magnetic sensor 1A will be provided for that of the second magnetic sensor 1B.

As shown in FIG. 6, the microwave generator 10A includes a first microwave oscillator 11, a second microwave oscillator 12, a switch 13 and a power amplifier 14. The first microwave oscillator 11 outputs a first microwave modulated at a first phase in a predetermined modulation frequency. The second microwave oscillator 12 outputs a second microwave modulated at a second phase different from the first phase in the modulation frequency. The switch 13 switches between a first state in which the antenna 8 is connected with the first microwave oscillator 11 and a second state in which the antenna 8 is connected with the second microwave oscillator 12. An output terminal Fout in the first microwave oscillator 11 is connected to a first input terminal MW1 in the switch 13, and an output terminal Fout in the second microwave oscillator 12 is connected to a second input terminal MW2 in the switch 13. An output terminal in the switch 13 is connected to an input terminal in the power amplifier 14. The switch 13 is a diode switch, and switches between a first connection state for connecting the first microwave oscillator 11 with the power amplifier 14, and a second connection state for connecting the second microwave oscillator 12 with the power amplifier 14 by a switching signal SMOD. The output terminal in the power amplifier 14 is connected to an input terminal in the antenna 5A.

In the first connection state for the switch 13, a microwave oscillating by the first microwave oscillator 11 is amplified by the power amplifier 14, and is input to the antenna 5A. On the other hand, in the second connection state for the switch 13, a microwave oscillating by the second microwave oscillator 12 is amplified by the power amplifier 14, and is input to the antenna 5A.

Each of the first and second microwave oscillators 11 and 12 has an FM (Frequency Modulation) modulation input terminal FMa, an FM modulation input terminal FMb and a reference frequency input terminal FD.

The lock-in detecting element 20A includes a preamplifier 21, a lock-in amplifier 22, a first integrating circuit 23 and a second integrating circuit 24. An input terminal in the preamplifier 21 is connected to an output terminal in the optical sensor 4A. The lock-in amplifier 22 outputs first output signals at the first phase at which the first microwave is modulated in the first microwave oscillator 11, and outputs a second output signal at the second phase at which the second microwave is modulated in the first microwave oscillator 12. An intensity signal output from the optical sensor 4A is input to the lock-in amplifier 22. The first integrating circuit 23 generates a first integrating signal integrating the first output signals output from the lock-in amplifier 22, and output the generated first integrating signal to the first microwave oscillator 11. The second integrating circuit 24 generates a second integrating signal integrating the second output signals output from the lock-in amplifier 22, and output the generated second integrating signal to the second microwave oscillator 12.

An output terminal in the preamplifier 21 is connected to an input terminal in the lock-in amplifier 22. A detected signal indicating the intensity of the red fluorescence RL output from the optical sensor 4A is amplified by the preamplifier 21, and is input to the lock-in amplifier 22. Further, an XA output terminal in the lock-in amplifier 22 is connected to an input terminal in the first integrating circuit 23, and a YA output terminal in the lock-in amplifier 22 is connected to an input terminal in the second integrating circuit 24.

The frequency controller 30A includes an MC (microcontroller) 31, a rectangle wave generator 32, a timing controller 33, a first AD converter 34 and a second AD converter 35. An output terminal in the rectangle wave generator 32 is connected to the FM modulation input terminal FMa in the first microwave oscillator 11 and the FM modulation input terminal FMa in the second microwave oscillator 12, a rectangle wave having a frequency FM1 and generated by the rectangle wave generator 32 is input to the first and second microwave oscillators 11 and 12 as a modulation signal.

The FM modulated signal having the frequency FM1 and output from the rectangle wave generator 32 is input to the lock-in amplifier 22. The lock-in amplifier 22 outputs an analog signal of a differential ODMR in synchronization with the FM modulated signal output from the rectangle wave generator 32, as explained later.

An output terminal in the first integrating circuit 23 is connected to an input terminal in the first AD converter 34 and the FM modulated input terminal FMb in the first microwave oscillator 11. On the other hand, an output terminal in the second integrating circuit 24 is connected to an input terminal in the second AD converter 35 and the FM modulated input terminal FMb in the second microwave oscillator 12. A first output signal indicating a value XA is an analog signal output from the XA output terminal in the lock-in amplifier 22, and is integrated by the first integrating circuit 23. A first integrated signal indicating an integrated value IXA and output from the first integrating circuit 23 is input to the first AD converter 34 and the first microwave oscillator 11. On the other hand, a second output signal indicating a value YA is an analog signal output from the YA output terminal in the lock-in amplifier 22, and is integrated by the second integrating circuit 24. A second integrated signal indicating an integrated value IYA output from the second integrating circuit 24 is input to the second AD converter 35 and the second microwave oscillator 12.

The first AD converter 34 converts the integrated value IXA which corresponds to an analog signal output from the first integrating circuit 23 to a digital signal. The second AD converter 35 converts the integrated value IYA which corresponds to an analog signal output from the second integrating circuit 24 to a digital signal.

The lock-in amplifier 22 detects an input signal from the preamplifier 21 in synchronization with an FM modulated signal having the frequency FM1 output from the rectangle wave generator 32. The MC31 includes a monitor 311, a first feedback controller 312, a second feedback controller 313 and a magnetic field and temperature calculator 314. The magnetic field and temperature calculator 314 may calculate at least one of a magnetic field and temperature based on a first integrating signal output from the first integrating circuit 23 and a second integrating signal output from the second integrating circuit 24, and it is not essential for the magnetic field and temperature calculator 314 to calculate both of the magnetic field and temperature.

An output terminal in the first feedback controller 312 is connected to a reference frequency input terminal FD in the first microwave oscillator 11. The first feedback controller 312 calculates a reference frequency FD1 for the first microwave oscillator 11 based on the first digital signal output from the first AD converter 34, and outputs the reference frequency FD1 to the first microwave oscillator 11. The reference frequency FD1 is set to an approximation of one peak in an ODMR spectrum (resonant frequency $R_L$).

An output terminal in the second feedback controller 313 is connected to a reference frequency input terminal FD in the second microwave oscillator 12. The second feedback controller 313 calculates a reference frequency FD2 for the second microwave oscillator 12 based on the second digital signal output from the second AD converter 35, and outputs the reference frequency FD2 to the second microwave oscillator 12. The reference frequency FD2 is set to an approximation of the other peak in an ODMR spectrum (resonant frequency $R_H$).

The reference frequency FD1 output from the first feedback controller 312 and the reference frequency FD2 output from the second feedback controller 313 are input to the monitor 311. The monitor 311 calculates a sum value of the reference frequency FD1 output from the first feedback controller 312 and a frequency output from the first AD converter 34 and input to the first feedback controller 312 (a signal AD converted from an analog signal output from the first integrating circuit 23, i.e., an input to the first feedback controller 312), and monitors the calculated value. On the other hand, the monitor 311 calculates a sum value of the reference frequency FD2 output from the second feedback controller 313 and a frequency output from the second AD converter 35 and input to the second feedback controller 313 (a signal AD converted from an analog signal output from the second integrating circuit 24, i.e., an input to the second feedback controller 313), and monitors the calculated value.

A signal indicating the reference frequency FD1 which is a digital signal output from the first feedback controller 312, a FM modulated signal having the frequency FM1 which is a rectangle wave output from the rectangular wave generator 32, and an integrated value IXA which corresponds to an analog signal output from the first integrating circuit 23 are input to the first microwave oscillator 11. The first microwave oscillator 11 outputs an FM modulated wave having the frequency $F_{AL}$ which corresponds to frequency modulated signal modulating the reference frequency FD1 with the FM modulated signal having the frequency FM1 and the integrated value IXA (see following equation (4)).

$$F_{AL}=FD1+IXA*\alpha \pm F_{DEV} \tag{4}$$

The $\alpha$ is a deviation width of a frequency when 1V is input to the FMb terminal in the first microwave oscillator 11.

A signal indicating the reference frequency FD2 which corresponds to a digital signal output from the second feedback controller 313, a FM modulated signal having the frequency FM1 which is a rectangle wave output from the rectangular wave generator 32, and an integrated value IYA which corresponds to an analog signal output from the second integrating circuit 24 are input to the second microwave oscillator 12. The second microwave oscillator 12 outputs an FM modulated wave having the frequency $F_{AH}$ which is frequency modulated signal modulating the reference frequency FD1 with FM modulated signal having the frequency FM1 and the integrated value IYA (see following equation (5)).

$$F_{AH}=FD2+IYA*\alpha \pm F_{DEV} \tag{5}$$

The $\alpha$ is a deviation width of a frequency when 1V is input to the FMb terminal of the second microwave oscillator 12.

The magnetic field and temperature calculator 314 calculates a magnetic field $B_A$ by the following equation (6), and calculates a temperature TA by the following equation (7).

$$B_A=1/\gamma*\{(FD1+IXA*\alpha)-(FD2+IYA*\alpha)\} \tag{6}$$

$$TA=1/T*\{((FD1+IXA*\alpha)+(FD2+IYA*\alpha))/2\} \tag{7}$$

The $\gamma$ is a magnetic rotational ratio (28.07 MHz/mT). The T is a temperature coefficient for the NV center (−74.2 kHz/K).

Figure 7:
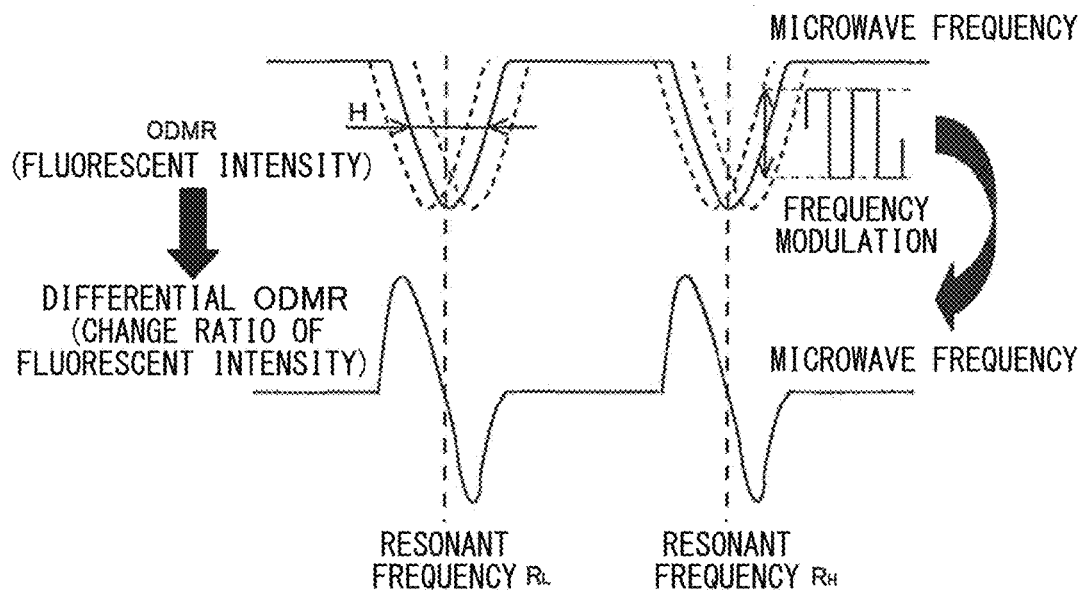
FIG. 7 is a waveform chart for explaining how to detect two peaks in an ODMR spectrum.

FIG. 7 is a waveform diagram for explaining how to detect two peaks in an ODMR spectrum. The upper waveform in FIG. 7 shows a spectrum for a fluorescence intensity of an ODMR spectrum, the lower waveform in FIG. 7 shows a spectrum for a change rate of the fluorescence intensity of FD1 (hereinafter referred to as a differential ODMR) obtained when the signal of the reference frequency FD1 is frequency modulated by an FM modulation signal having a frequency FM1. A frequency corresponding to a left side peak in an ODMR spectrum in FIG. 7 (resonance frequency $R_L$) is a value approximately equal to the reference frequency FD1, and a frequency corresponding to a right side peak in an ODMR spectrum in FIG. 7 (resonance frequency $R_H$) is a value approximately equal to the reference frequency FD2.

A frequency at which the differential ODMR is equal to 0 shown in the lower left side of FIG. 7 corresponds to the resonant frequency $R_L$. The differential ODMR shown in the lower left side of FIG. 7 is a signal output from the XA output terminal in the lock-in amplifier 22. On the other hand, a frequency at which the differential ODMR is equal to 0 shown on the lower right side of FIG. 7 corresponds to the resonant frequency $R_H$. The differential ODMR shown in the lower right side of FIG. 7 is a signal output from the YA output terminal in the lock-in amplifier 22.

The first magnetic sensor 1A measures the magnetic field $B_A$ by separating the effect of temperature drift, by simultaneously following the frequencies $F_{AL}$ and $F_{AH}$ for the microwaves output from the first and second microwave oscillators 11 and 12 to a set of resonant frequencies $R_L$ and $R_H$, by using the values XA and YA output from the output terminals XA and YA in the lock-in amplifier 22.

Figure 8:
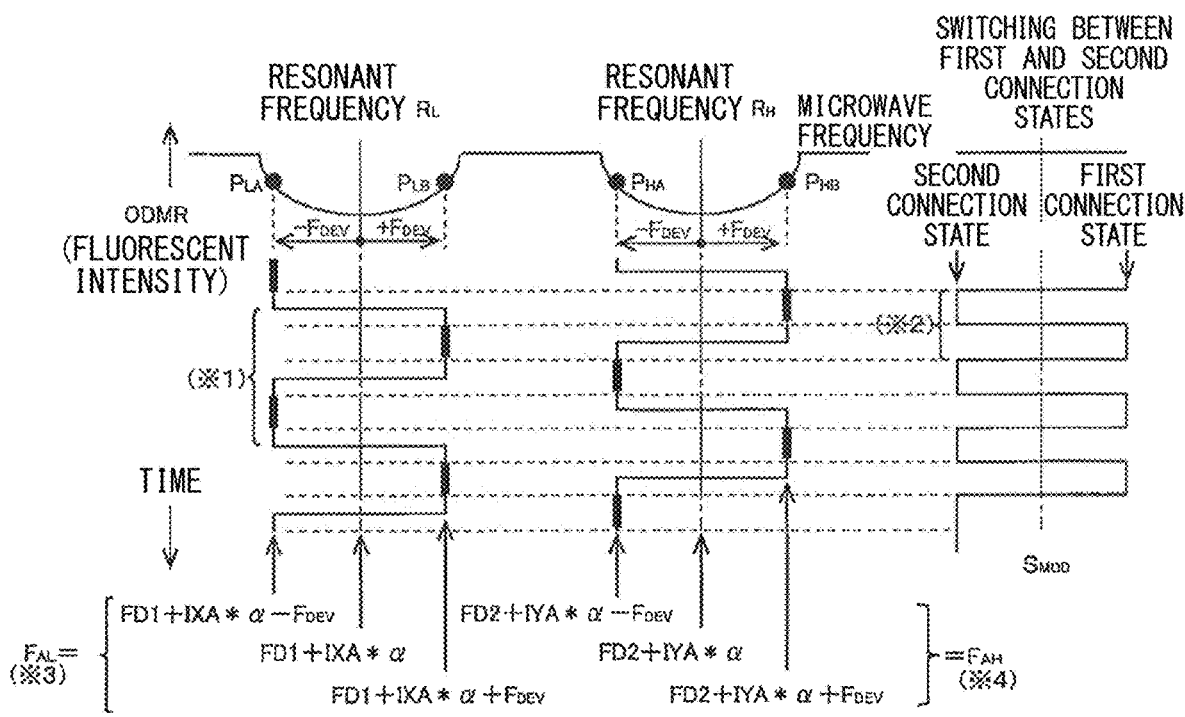
FIG. 8 is a sequence chart illustrating a relationship among an ODMR spectrum, pulses output from first and second microwave oscillators, and pulses output from a rectangle wave generator.

FIG. 8 is a sequence chart illustrating the relationship among an ODMR spectrum, pulses output from the first and second microwave oscillators 11 and 12, and pulses output from the rectangle wave generator 32 (see FIG. 6). As shown in the sequence chart in FIG. 8, the frequency FM1 for a FM modulated signal input to the first microwave oscillator 11 is the same as the frequency FM1 for a FM modulated signal input to the second microwave oscillator 12. On the other hand, the phase of the FM modulated signal input to the first microwave oscillator 11 is 90° different from that of the FM modulated signal input to the second microwave oscillator 12. A frequency of the switching signal SMOD for switching between output terminals in the first and second microwave oscillators 11 and 12 by the switch 13 is twice larger than the frequency FM1. The change points (rising and falling phases) of the switching signal SMOD are 45° different from that of FM modulated signals input to the first and second microwave oscillators 11 and 12.

The value XA output from the lock-in amplifier 22 is a value indicating a deviation from the resonance frequency $R_L$, and is represented by the following equation (8). Further, the value YA output from the lock-in amplifier 22 is a value indicating a deviation from the resonance frequency $R_H$, and is represented by the following equation (9).

$$XA=K*((P_{LA}+P_{LB})/2-R_L) \quad (8)$$

$$YA=K*((P_{HA}+P_{HB})/2-R_H) \quad (9)$$

The point $P_{LA}$ is a lower frequency side operation point of the resonance frequency $R_L$, and is represented by the following equation (10), and the point $P_{LB}$ is a higher frequency side operating point of the resonance frequency $R_L$, is represented by the following equation (11). The K is a proportional constant.

$$P_{LA}=FD1+IXA*\alpha-F_{DEV} \quad (10)$$

$$P_{LB}=FD1+IXA*\alpha+F_{DEV} \quad (11)$$

Further, the point $P_{HA}$ is a lower frequency side operation point of the resonance frequency $R_H$, and is represented by the following equation (12), and the point $P_{HB}$ is a higher frequency side operating point of the resonance frequency $R_H$, and is represented by the following equation (13).

$$P_{HA}=FD2+IYA*\alpha-F_{DEV} \quad (12)$$

$$P_{HB}=FD2+IYA*\alpha+F_{DEV} \quad (13)$$

The four operating points $P_{LA}$, $P_{LB}$, $P_{HA}$ and $P_{HB}$ are points having similar fluorescence intensity on both slopes in "turning points" in the ODMR spectrum near the resonant frequency in the ODMR spectrum, and appear within one cycle of the FM modulated signal output from the first and second microwave oscillators 11 and 12 with 90° shifted each other.

The value XA and YA output from the lock-in amplifier 22 are quadrature phase components for each other. The frequency $F_{AL}$ for a microwave output from the first microwave oscillator 11 is controlled by the integrated value IXA obtained by integrating the value XA and input to the FM modulated input terminal FMb in the first microwave oscillator 11. Further, the frequency $F_{AH}$ for the microwave output from the second microwave oscillator 12 is controlled by the integrated value IXB obtained by integrating the value XB and input to the FM modulated input terminal FMb in the second microwave oscillator 12. The feedback controls for the frequencies $F_{AL}$ and $F_{AH}$ for the microwaves output from the first and second microwave oscillators 11 and 12 may be independently performed each other.

The change amount from the median value $(P_{LA}+P_{LB})/2$ between the operating points $P_{LA}$ and $P_{LB}$ in the resonance frequency $R_L$ is required to be equal to or less than a half width at half maximum H/2 to a peak of the "turning point" in an ODMR spectrum, so that the frequency $F_{AL}$ for the microwave output from the first microwave oscillator 11 follow the resonance frequency $R_L$. The H is a full width at half maximum, and although the H depends on characteristics for the NV centers in the diamond element 2A, the H is generally in range from several hundred kHz to several MHz.

The change amount from the median value $(P_{HA}+P_{HB})/2$ between the operating points $P_{HA}$ and $P_{HB}$ in the resonance frequency $R_H$ is required to be equal to or less than a half width at half maximum H/2 to the peak of the "turning point" in an ODMR spectrum, so that the frequency $F_{AH}$ for the microwave output from the second microwave oscillator 12 follow the resonance frequency $R_H$.

In particular, in order to correspond to the expansion for a measuring range with the expansion for a output current range in an electric vehicle, the frequencies $F_{AL}$ and $F_{AH}$ for the microwave output from the first and second microwave oscillators 11 and 12 are required to follow 1 GHz or more variations of the operating points $P_{LA}$, $P_{LB}$, $P_{HA}$ and $P_{HB}$. In the present embodiment, an analog signal output from the first integrating circuit 23 is AD converted by the first AD converter 34, and is feedback controlled to the reference frequency FD1 input to the first microwave oscillator 11 at a fixed time sufficiently shorter than variation time of the resonance frequency $R_L$, as below explained. Further, an analog signal output from the second integrating circuit 23 is AD converted by the second AD converter 35, and is feedback controlled to the reference frequency FD2 input to the first microwave oscillator 12 at a fixed time sufficiently shorter than the variation time of the resonance frequency $R_H$.

Figure 9:
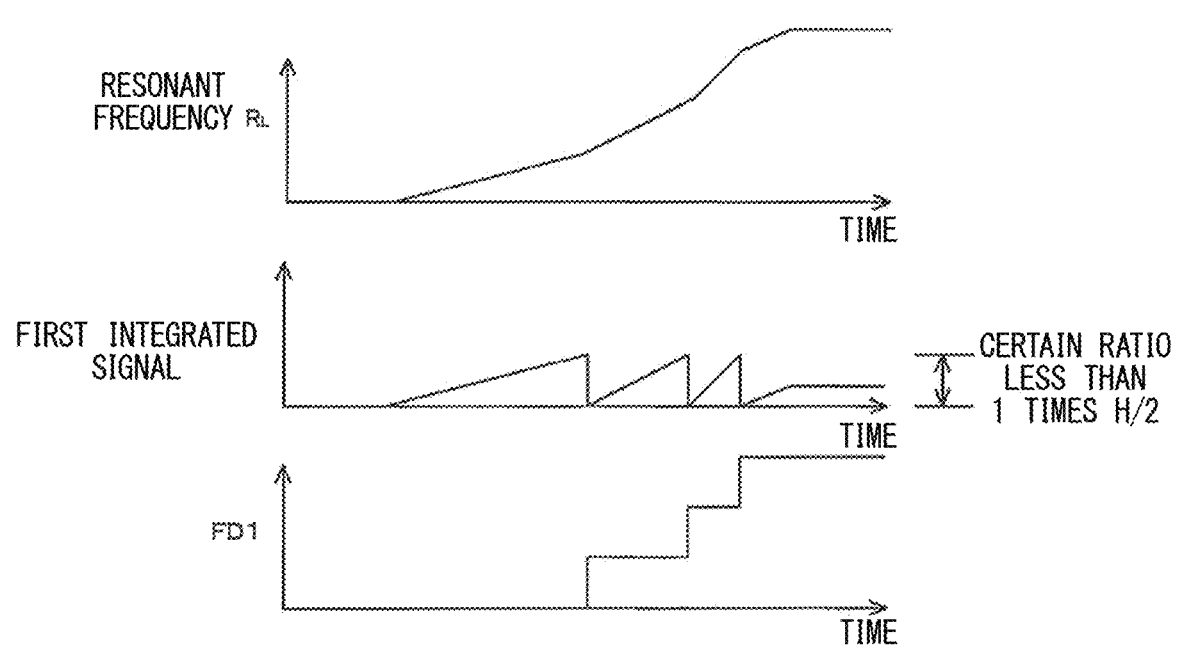
FIG. 9 is a timing chart illustrating changes in analog signals output from the first and second integrating circuits and a reference frequency when a resonance frequency varies.

FIG. 9 is a timing chart illustrating variations of an analogs signal output from the first integrating circuit 23 and the reference frequency FD1 when the resonance frequency $R_L$ varies. Although the variation of the analog signal output from the first integrating circuit 23 and the reference frequency FD1 when the resonance frequency $R_L$ fluctuations will be explained, a variation of an analog signal output from the second integrating circuit 24 and the reference frequency FD2 when the resonance frequency $R_H$ varies is similar to that of the analog signal output and reference frequency FD1.

As shown in the timing chart of FIG. 9, if a change amount of the resonance frequency $R_L$ is within a half width at half maximum H/2 to a peak in an ODMR spectrum, an analog signal output from the first integrating circuit 23 always changes to follow the resonance frequency $R_L$. However, if the change amount in the resonance frequency $R_L$ exceeds the half width at half maximum H/2, the analog signal output from the first integrating circuit 23 does not follow the resonance frequency $R_L$. Therefore, when the change amount of the resonance frequency $R_L$ is equal to or greater than a certain ratio of the half width at half maximum H/2, the reference frequency FD1 is changed by a certain ratio of the half width at half maximum H/2. A constant ratio is a constant of less than 1. Then, the analog signal output from the first integrating circuit 23 returns to 0. If the change amount of the resonant frequency $R_L$ is further increased to reach the certain ratio of the half width at half maximum H/2, the reference frequency FD1 is further changed by the certain ratio of the half width at half maximum H/2. Then, the analog signal output from the first integrating circuit 23 returns to 0. The signal output from the first integrating circuit 23 may be suppressed to a value corresponding the certain ratio of the half width at half maximum H/2 of the peak of an ODMR spectrum, as a frequency modulation width of the first microwave oscillator 11, by repeating changes of the reference frequency FD1 in accordance with a change amount of the resonance frequency $R_L$.

Since the control path from the first integrating circuit 23 to the FM modulated input terminal FMb in the first microwave oscillator 11 is an analog signal path, changes of the reference frequency FD1 may follow changes in the resonance frequency $R_L$ at high speed. On the other hand, a feedback control, update of the reference frequency FD1, and change in the frequency $F_{AL}$ for the microwave output from the first microwave oscillator 11 based on updating the reference frequency FD1 are digital signal paths including AD converting in the first AD converter 34 and digital signal processing using AD converted signals, and therefore a delay is occurred for processing the feedback control, update thereof and change therein. The monitoring for the reference frequency FD1 is not sufficient to monitor the operating points $P_{LA}$ and $P_{LB}$.

Further, since the control path from the second integrating circuit 24 to the FM modulated input terminal FMb in the second microwave oscillator 12 is an analog signal path, the control path may follow changes in the resonance frequency $R_H$ at high speed. However, a feedback control, update of the reference frequency FD2, and change in the frequency $F_{AH}$ for the microwave output from the second microwave oscillator 12 based on updating the reference frequency FD2 are digital signal paths including AD converting in the second AD converter 35 and digital signal processing using AD converted signal, and therefore a delay is occurred for processing the feedback control, update thereof and change therein. The monitoring for the reference frequency FD2 is not sufficient to monitor the operating points $P_{HA}$ and $P_{HB}$.

In the present embodiment, the monitor 311 calculates a sum value of the reference frequency FD1 output from the first feedback controller 312 and a frequency output from the first AD converter 34 and input to the first feedback controller 312 (a signal AD converted from an analog signal output from the first integrating circuit 23, i.e., a signal input to the first feedback controller 312), and monitors the calculated value. Further, the monitor 311 calculates a sum value of the reference frequency FD2 output from the second feedback controller 313 and a frequency output from the second AD converter 35 and input to the second feedback controller 313 (a signal AD converted from an analog signal output from the second integrating circuit 24, i.e., an input of the second feedback controller 313), and monitors the calculated value.

As above explained, in the sensor 1a according to the first embodiment, the first and second magnetic sensors 1A and 1B may the measure magnetic fields $B_A$ and $B_B$ without temperature drift. The magnetic field $B_I$ is measured with high precision and suppressing the effect of the external magnetic field $B_O$, regardless of temperature differences due to positions of the diamond elements 2A and 2B, by calculating a difference between the measured magnetic fields $B_A$ and $B_B$, and determining the magnetic field $B_I$ due to a current flowing through the bus bar 9 based on the calculated difference.

In the sensor 1a according to the first embodiment, the diamond elements 2A and 2B in the first and second magnetic sensors 1A and 1B are disposed so as to face each other across the bus bar 9. Further, a distance between the diamond element 2A and the lower surface of the bus bar 9 is set to be equal to a distance between the diamond element 2B and the upper surface of the bus bar 9. Thus, the first and second magnetic sensors 1A and 1B may measure magnetic fields and temperatures around the bus bar 9. Further, temperature gradients of the upper and lower sides of the bus bar 9 may be measured.

Further, in the first and second magnetic sensors 1A and 1B, after the red fluorescence $R_L$ emitted from the diamond elements 2A and 2B is detected by the optical sensors 4A and 4B, the frequencies $F_{AL}$, $F_{AH}$, $F_{BL}$ and $F_{BH}$ for the microwave is controlled by the feedback control from the lock-in detector 20A to the microwave generator 10A via the frequency controller 30A and the feedback control from the lock-in detector 20B to the microwave generator 10B via the frequency controller 30B. Since the center positions of the "turning points" in ODMR spectrums output from the diamond elements 2A and 2B are tracked in the feedback controls, there are no problems even if characteristics of details such as the depths or widths of the "turning points" are slightly different from each other in the diamond elements 2A and 2B. Therefore, the magnetic field $B_I$ may be measured with high precision, and suppressing the effect of an external magnetic field $B_O$, regardless of variations in characteristics of the diamond elements 2A and 2B. Further, the frequencies $F_{AL}$, $F_{AH}$, $F_{BL}$ and $F_{BH}$ for microwaves output from the first and second microwave oscillators 11 and 12 may follow the resonant frequencies $R_L$ and $R_H$ at high speed, since direct feedback controls from the lock-in detecting element 20A to the microwave generator 10A and from the lock-in detecting element 20B to the microwave generator 10B are realized by directly returning signals from the output terminals XA and YA in the lock-in amplifier 22 to the first and second microwave oscillators 11 and 12, after the signals are integrated by the first and second integrating circuits 23 and 24.

Further, in the sensor 1a according to the first embodiment, signals output from the lock-in detecting elements 20A and 20B are input to the frequency controllers 30A and 30B. Then, if outputs from the lock-in detecting elements 20A and 20B are equal to or greater than a certain ratio of less than the half width at half maximum H/2 of ODMR, the reference frequencies input to the microwave generators 10A and 10B are changed. Thus, even if variation ranges of peaks in an ODMR spectrum are larger than the half width at half maximum H/2 of ODMR, the frequencies $F_{AL}$, $F_{AH}$, $F_{BL}$ and $F_{BH}$ generated by the microwave generators 10A and 10B may be adjusted in accordance with variations of the peaks in an ODMR spectrum. Thus, the frequencies $F_{AL}$, $F_{AH}$, $F_{BL}$ and $F_{BH}$ may follow a disturbance having a large dynamic range, and a leakage current from the bus bar 9 in an electric vehicle may be detected with high precision. Further, the lock-in detecting elements 20A and 20B output signals obtained by integrating changes of signals output from the optical sensors 4A and 4B, and therefore the signals are obtained by integrating changes of magnetic fields and temperatures detected by the diamond elements 2A and 2B. Thus, even if a transient rapid changes are occurred in magnetic fields and temperatures, signals output from the lock-in detectors 20A and 20B are smoothly change by integral time constant. Since the frequency controllers 30A and 30B may change reference frequencies input to the microwave generators 10A and 10B based on measurement results of signals output from the lock-in detectors 20A and 20B in a sufficiently short time interval than the integral time constant, the magnetic fields and temperatures may be accurately calculated. Even if a delay in feedback controls for a negative feedback circuit transiently occurs, the feedback controls for the negative feedback circuit may follow the measurement results, after a certain time has elapsed, and therefore integrated current values may be accurately measured. Therefore, charge and discharge amounts in a battery may be accurately grasped, that is particularly important in an electric vehicle.

Further, in the sensor 1a according to the first embodiment, the phase of a FM modulated signal input to the first microwave oscillator 11 is 90° different from that of a FM modulated signal input to the second microwave oscillator 12. Further, a frequency of the switching signal SMOD for the switch 13 to switch outputs from the first and second microwave oscillators 11 and 12 is twice larger than frequencies FM1 of FM modulated signals input to the first and second microwave oscillators 11 and 12. Furthermore, the change points of the switching signal (rising and falling phases) are 45° different from that of the FM modulated signals input to the first and second microwave oscillators 11 and 12. Thus, it is sufficient to provide one lock-in amplifier 22 to each of the first and second magnetic sensors 1A and 1B, and therefore configurations of the first and second magnetic sensors 1A and 1B may be simplified.

Further, in the sensor 1a according to the first embodiment, a pair of first and second magnets 6 and 7 are disposed so as to face each other across the bus bar 9, and a static magnetic field is applied around the first and second magnetic sensors 1A and 1B, and therefore a split $(R_L-R_H)$ between the resonance frequencies $R_L$ and $R_H$ is always maintained at a predetermined value (>0) or more. Thus, even if the split between the resonance frequencies $R_L$ and $R_H$ is greatly changed to the decreasing direction, the split may be ensured, and therefore magnetic fields $B_A$ and $B_B$ defined by the split may be measured.

Further, in the sensor 1a according to the first embodiment, since the diamond elements 2A and 2B are disposed to face each other across the bus bar 9, the bus bar 9 functions as an electromagnetic shield between the diamond elements 2A and 2B. Thus, interference between microwaves from the first and second magnetic sensors 1A and 1B may be prevented.

Further, the sensor 1a according to the first embodiment has no in-phase noises from the light source 81, since the light source 81 in the optical system 8 is shared by the first and second magnetic sensors 1A and 1B.

Figure 10:
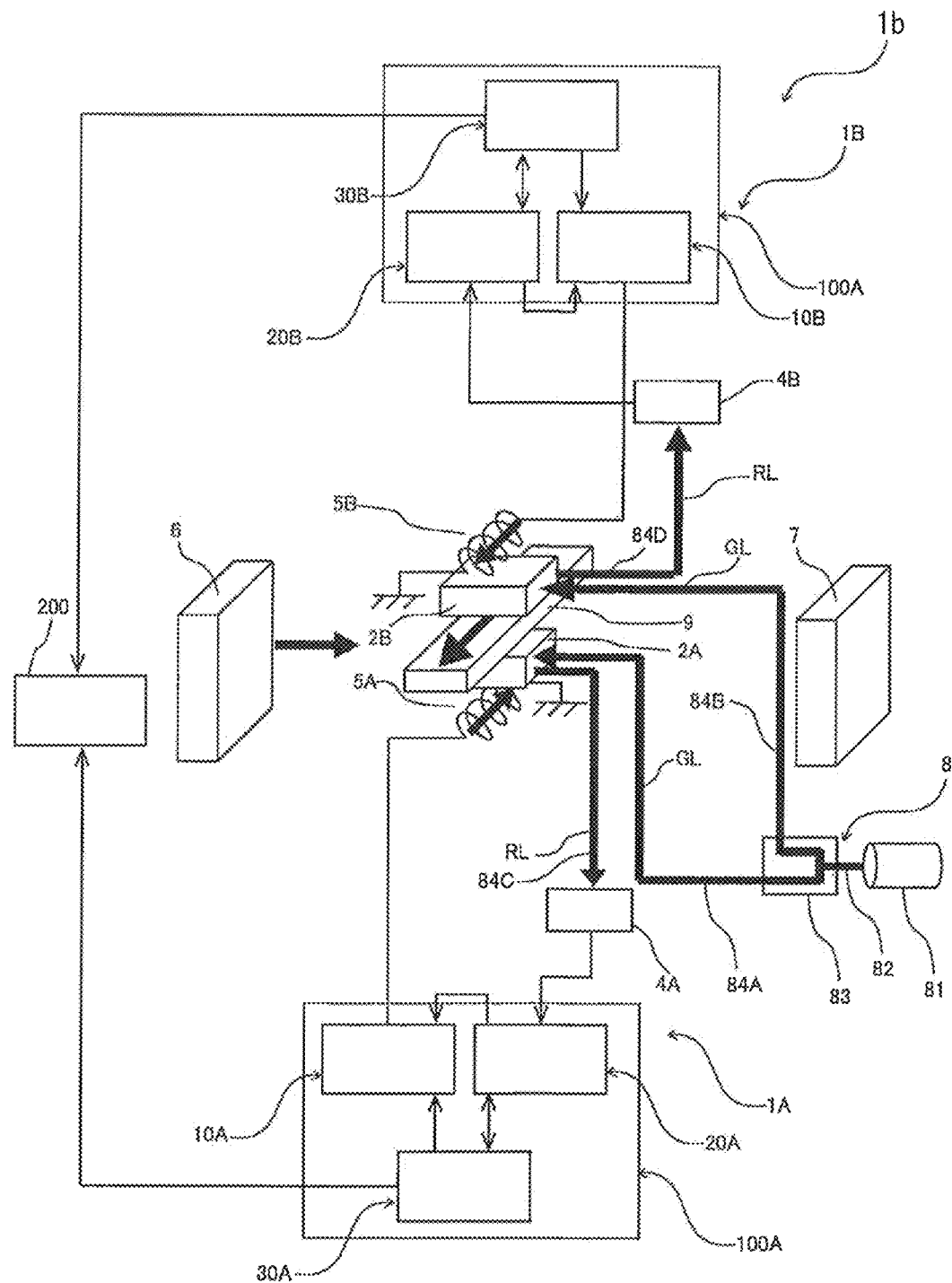
FIG. 10 is a diagram illustrating a sensor according to a second embodiment of the present disclosure.

FIG. 10 is a diagram illustrating a sensor 1b according to a second embodiment of the present disclosure. The same reference numerals denote the same configurations as that of the first embodiment, with reference to descriptions in the first embodiment.

As shown in FIG. 10, in the sensor 1b according to the second embodiment, the diamond elements 2A and 2B in the first magnetic sensors 1A and 1B are disposed so as to face each other across the bus bar 9 in the thickness direction thereof. <111> directions in the diamond elements 2A and 2B are disposed perpendicular to the upper and lower surfaces of the bus bar 9. In FIG. 10, although the <111> directions are disposed parallel to the upper and lower surfaces of the bus bar 9, even if the <111> directions are disposed vertically, a plurality of NV axes in the diamond elements 2A and 2B includes NV axes having components parallel to the upper and lower surfaces of the bus bar 9, since the NV axes always has four orientations, as shown in FIG. 2. Similar to the sensor 1a in FIG. 1, the first and second magnets 6 and 7 applies a static magnetic field to the diamond elements 2A and 2B across the diamond elements 2A and 2B in a direction parallel to the upper and lower surfaces of the bus bar 9. On the other hand, the antennas 5A and 5B emit microwave magnetic fields in a direction perpendicular to the NV axes perpendicular to a direction of a current flowing through the bus bar 9.

Figure 11:
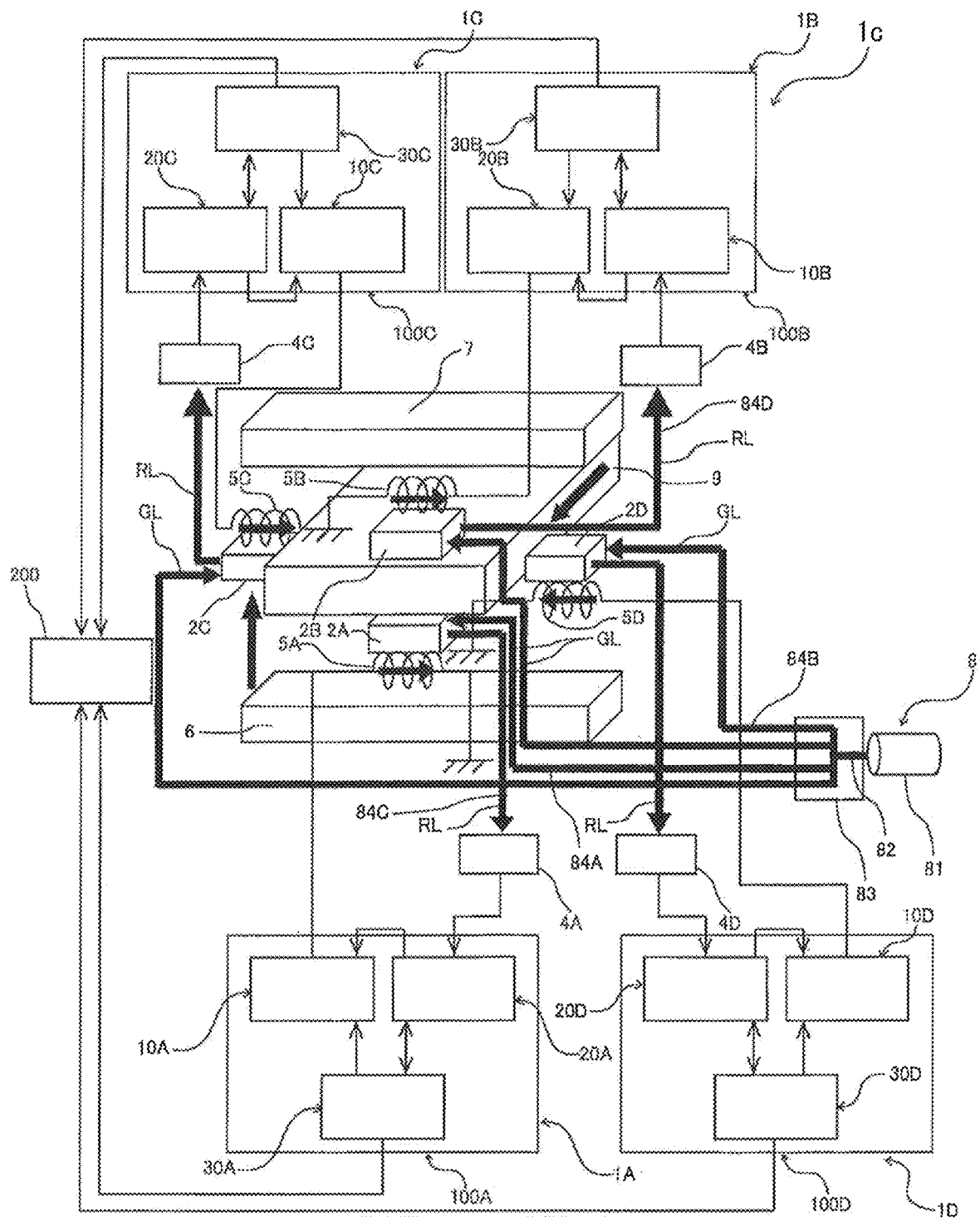
FIG. 11 is a diagram illustrating a sensor according to a third embodiment of the present disclosure.

FIG. 11 is a diagram illustrating a sensor 1c according to third embodiment of the present disclosure. The same reference numerals denote the same configurations as that of the first and second embodiments, with reference to descriptions in the first and second embodiments.

As shown in FIG. 11, the sensor 1c according to the third embodiment includes third and fourth magnetic sensors 1C and 1D, in addition to the first and second magnetic sensors 1A and 1B. Configurations of the first and second magnetic sensors 1A and 1B is the same as that of the sensor 1b according to the second embodiment.

The third magnetic sensor 1C includes a diamond element 2C, an optical sensor 4C, an antenna 5C and a controller 100C. The diamond element 2C has NV centers, and is disposed close to one side of the bus bar 9 (left side in FIG. 11). The optical system 8 radiates green light GL as excitation light to the diamond element 2C. The optical sensor 4C detects optical signals generated by electronic spin resonance in the NV centers. The antenna 5C radiates a frequency variable microwave magnetic field to the diamond element 2C. The controller 100C includes a microwave generator 10C, a lock-in detector 20C and a frequency controller 30C. The microwave generator 10C supplies microwaves to the antenna 5C. The functions of the lock-in detecting element 20C is similar to that of the lock-in detecting elements 20A and 20B, and the functions of the frequency controller 30C is similar to that of the frequency controllers 30A and 30B.

The fourth magnetic sensor 1D includes a diamond element 2D, an optical sensor 4D, an antenna 5D and a controller 100D. The diamond element 2D has NV centers, and is disposed close to the other side surface of the bus bar 9 (right side in FIG. 11). The optical system 8 radiates green light GL as excitation light to the diamond element 2D. The optical sensor 4D detects optical signals generated by the electronic spin resonance in the NV centers. The antenna 5D radiates a frequency variable microwave magnetic field to the diamond element 2D. The controller 100D includes a microwave generator 10D, a lock-in detector 20D and a frequency controller 30D. The microwave generator 10D supplies microwaves to the antenna 5D. The functions of the lock-in detecting element 20D is similar to that of the lock-in detecting elements 20A and 20B and 20C, and the functions of the frequency controller 30D is similar to that of the frequency controllers 30A, 30B and 30C.

The diamond elements 2C and 2D are disposed so as to face each other across the bus bar 9 in a direction perpendicular to a current direction. <111> directions of the diamond elements 2C and 2D are disposed parallel to side surfaces of the bus bar 9. A plurality of NV axes in the diamond elements 2C and 2D include NV axes in an orientation perpendicular to a current direction in the bus bar 9. On the other hand, each of the antennas 5C and 5D emit microwave magnetic fields in a direction perpendicular to the NV axes extending to a direction perpendicular to a direction of a current flowing through the bus bar 9 of the diamond elements 2C and 2D.

The first and second magnets 6 and 7 are disposed so as to sandwich the diamond elements 2A and 2B and bus bar 9 in the thickness direction thereof, and apply a static magnetic field to the NV axes in the diamond elements 2A to 2D extending to a direction parallel to a direction perpendicular to a direction of a current flowing through the bus bar 9.

The processor 200 calculates a magnetic field $B_I$ generated by a current flowing through the bus bar 9 by the following equation (14).

$$B_I=((B_D-B_C)+(B_B-B_A)/\beta)/4 \quad (14)$$

The $B_A$ is a magnetic field measured by the first magnetic sensor 1A, and is calculated by the following equation (15). Further, the $B_B$ is a magnetic field measured by the second magnetic sensor 1B, and is calculated by the following equation (16). Further, the constant $\beta$ is a constant set in accordance with reductions of sensitivities in the first and second magnetic sensors 1A and 1B by applying the magnetic field $B_I$ generated by a current flowing through the bus bar 9, in a direction perpendicular to the <111> directions in the diamond elements 2A and 2B. The constant $\beta$ is estimated by prior calibrations or simulations. Further, the $B_C$ is a magnetic field measured by the third magnetic sensor 1C, and is calculated by the following equation (17). Further, $B_D$ is a magnetic field measured by the fourth magnetic sensor 1D, and is calculated by the following equation (18).

$$B_A=-\beta \times B_I+B_O \quad (15)$$

$$B_B=\beta \times B_I+B_O \quad (16)$$

$$B_C=-B_I+B_O \quad (17)$$

$$B_D=B_I+B_O \quad (18)$$

In the sensor 1c according to the third embodiment, the magnetic field $B_I$ generated by a current flowing through the bus bar 9 may be measured with eliminating the effect of the external magnetic field $B_O$ more precisely.

Figure 12:
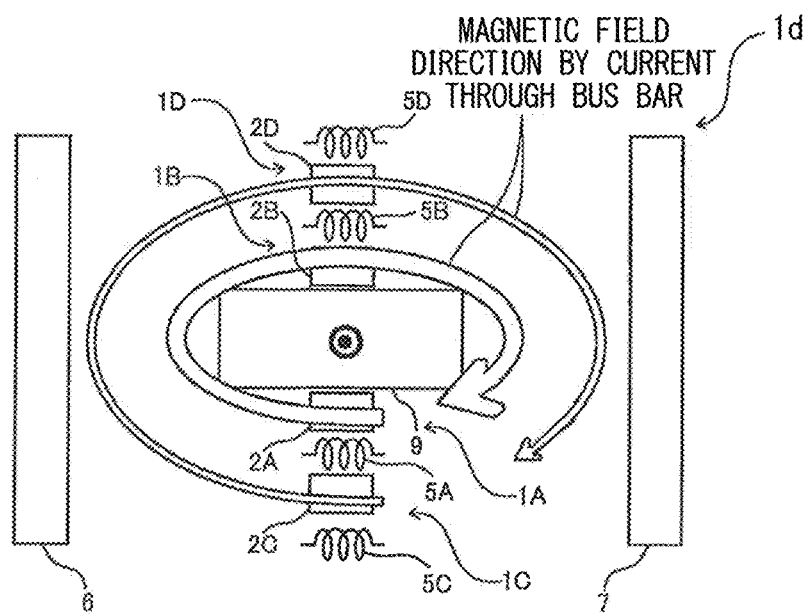
FIG. 12 is a diagram illustrating a sensor according to a fourth embodiment of the present disclosure.

FIG. 12 is a diagram illustrating a sensor 1d according to fourth embodiment of the present disclosure. The same reference numerals denote the same configurations as that of the first to third embodiments, with reference to the descriptions in the first to third embodiments.

As shown in FIG. 12, the sensor 1d according to the fourth embodiment includes first to fourth magnetic sensors 1A to 1D. The diamond elements 2A and 2B in the first and second magnetic sensor 1B face each other across the bus bar 9 in the thickness direction thereof. The diamond element 2A is close to the lower surface of the bus bar 9, and the diamond element 2B is close to the upper surface of the bus bar 9.

The diamond elements 2C and 2D in the third and fourth magnetic sensors 1C and 1D are disposed so as to sandwich the diamond elements 2A and 2B and bus bar 9 in the thickness direction of the bus bar 9. A distance between the diamond element 2C and the bus bar 9 is longer than a distance between the diamond element 2A and the bus bar 9. Further, a distance between the diamond element 2D and the bus bar 9 is longer than the distance between a diamond element 2B and the bus bar 9.

Figure 13:
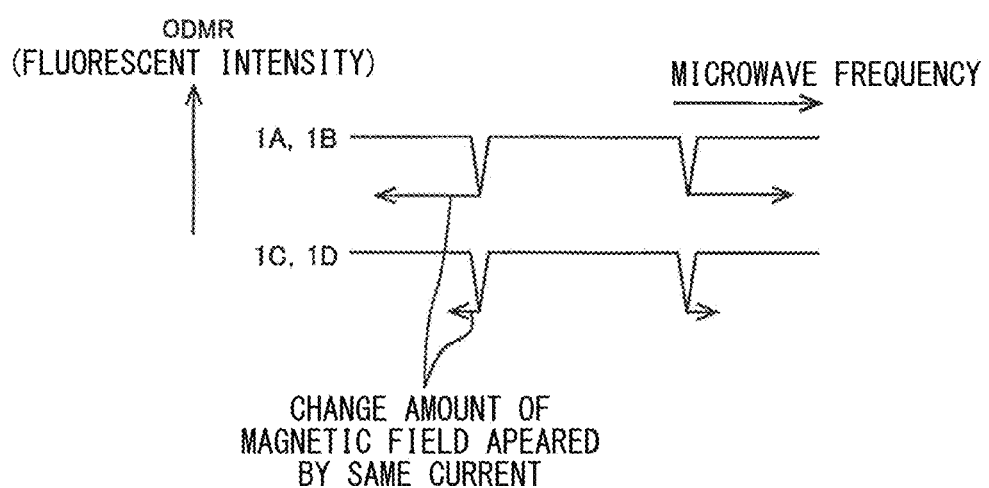
FIG. 13 is a diagram illustrating changes in magnetic fields measured by first to fourth magnetic sensors shown in FIG. 12.

FIG. 13 is a diagram illustrating changes in magnetic fields measured by the first to fourth magnetic sensors 1A to 1D shown in FIG. 12. FIG. 13 shows changes in magnetic fields measured by the first to fourth magnetic sensors 1A to 1D when a current flowing through the bus bars 9 are equal to each other. The horizontal axis in FIG. 13 is a frequency of the microwave, the vertical axes in FIG. 13 is an ODMR (fluorescent intensity).

As shown in FIG. 13, the longer a distance between the bus bar 9 and the magnetic sensors is, the smaller the magnitude of the detected magnetic field $B_I$ generated around the bus bar 9 by a current flowing through the bus bar 9 is. When a rapid change in a current flowing through the bus bar 9 appears, a large change in the magnetic fields detected by the first and second magnetic sensors 1A and 1B disposed in the vicinity of the bus bar 9. Therefore, the frequencies $F_{AL}$, $F_{AH}$, $F_{BL}$ and $F_{BH}$ for the microwaves input to the first and second magnetic sensors 1A and 1B do not follow a rapid change in a current flowing through the bus bar 9. On the other hand, changes in the magnetic fields detected by the third and fourth magnetic sensors 1C and 1D spaced from the bus bar 9 is small.

When a current flowing through the bus bar 9 is suddenly changed, the sensor 1d measures magnetic fields generated by a sudden change of a current flowing through the bus bar 9, by using the third and fourth magnetic sensors 1C and 1D. Specifically, the first magnetic sensor 1A output a first integrating signal indicating the integrated value IXA integrated by the first integrating circuit 23, and a second integrating signal indicating the integrated value IXA integrated by the second integrating circuit 23 to the processor 200 (see FIG. 1, etc.). The second magnetic sensor 1B output a first integrating signal indicating the integrated value IXB integrated by the first integrating circuit 23, and a second integrating signal indicating the integrated value IXB integrated by the second integrating circuit 23 to the processor 200. The processor 200 calculates the absolute value of (IYA−IXA)−(IYB−IXB). The processor 200 determines that a current flowing through the bus bar 9 is suddenly changed, when the calculated value shows a change exceeding a predetermined value within a certain short time, and calculates the magnetic field $B_I$ using signals output from the third and fourth magnetic sensors 1C and 1D.

The value IXA is an value calculated by integrating values XA representing deviations between the resonance frequency $R_L$ and a pair of the operation points $P_{LA}$ and $P_{LB}$ in the first magnetic sensor 1A, and the value IYA is an value calculated by integrating values YA representing the deviations between the resonance frequency $R_H$ and a pair of the operating points $P_{HA}$ and $P_{HB}$ in the first magnetic sensor 1A. Similar to the values IXA and IXB is an value calculated by integrating values XB representing deviations between the resonance frequency $R_L$ and a pair of operation points $P_{LA}$ and $P_{LB}$ in the second magnetic sensor 1B, and the value IYB is an value calculated by integrating values YB representing deviations between the resonance frequency $R_H$ and a pair of operating points $P_{HA}$ and $P_{HB}$ in the second magnetic sensor 1B. When the absolute value of (IYA−IXA)−(IYB−IXB) is increased, the feedbacks to the operating points $P_{LA}$, $P_{LB}$, $P_{HA}$ and $P_{HB}$ via the first and second integrating circuits 23 and 24 are increased in the first and second magnetic sensors 1A and 1B. When the absolute value of (IYA−IXA)−(IYB−IXB) is rapidly increased, a current flowing through the bus bar 9 is supposed to be a suddenly changed.

The external magnetic field $B_O$ affects the absolute value of (IYA−IXA) or the absolute value of (IYB−IXB). On the other hand, noises in the external magnetic field $B_O$ is eliminated in the absolute value of (IYA−IXA)−(IYB−IXB), and therefore the magnitude of the magnetic field $B_I$ generated by a current flowing through the bus bar 9 may be accurately measured.

Figure 14:
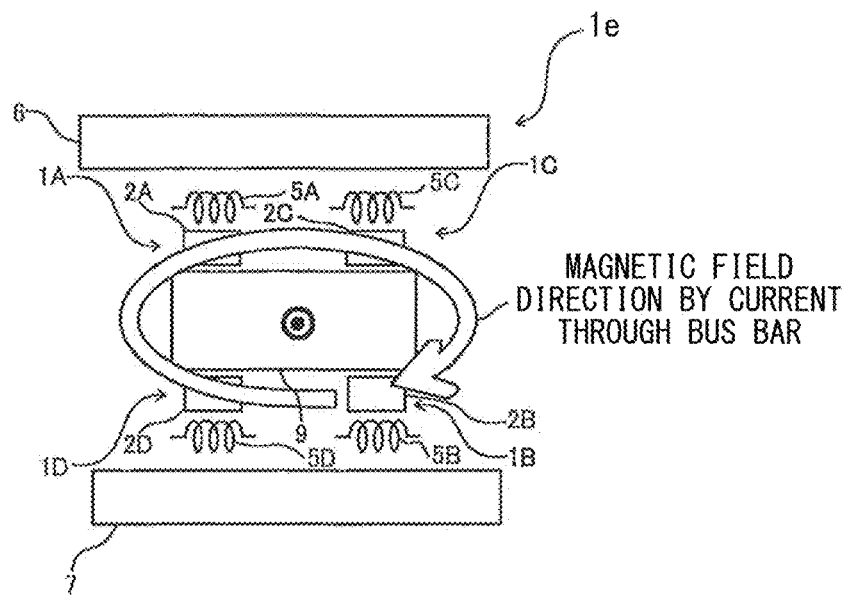
FIG. 14 is a diagram illustrating a sensor according to fifth embodiment of the present disclosure.

FIG. 14 is a diagram illustrating a sensor 1e according to fifth embodiment of the present disclosure. The same reference numerals denote the same configurations as that of the first to fourth embodiments, with reference to the descriptions in the first to fourth embodiments.

As shown in FIG. 14, the sensor 1e according to the fifth embodiment includes first to fourth magnetic sensors 1A to 1D. The diamond elements 2A and 2C in the first and third magnetic sensors 1A and 1C are disposed side by side in the width direction of the bus bar 9 at the upper surface side of the bus bar 9. On the other hand, the diamond elements 2B and 2D in the second and fourth magnetic sensors 1B and 1D are disposed side by side in the width direction of the bus bar 9 at the lower surface side of the bus bar 9. Further, the diamond elements 2A and 2D are disposed so as to face each other across the bus bar 9 in the thickness direction thereof, the diamond elements 2C and 2B are disposed so as to face each other across the bus bar 9 in the thickness direction thereof.

Figure 15:
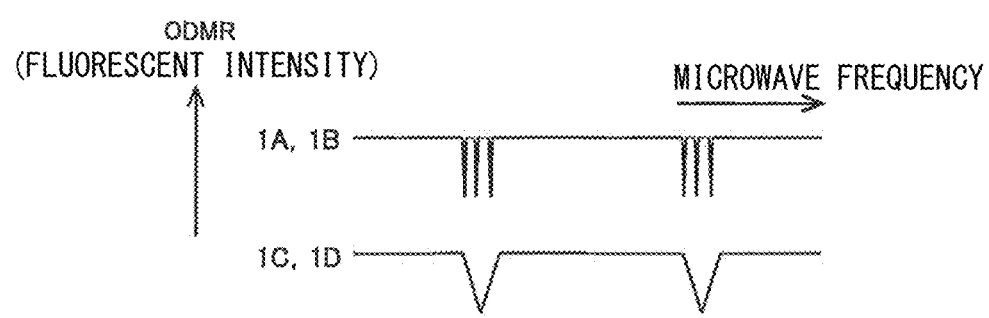
FIG. 15 is a diagram illustrating ODMR spectrums output from first to fourth magnetic sensors shown in FIG. 14.

FIG. 15 is a diagram illustrating ODMR spectrums output from the first to fourth magnetic sensors 1A to 1D shown in FIG. 14. As shown FIG. 15, widths of the "turning points" in the ODMR spectrums output from the first and second magnetic sensors 1A and 1B are narrower than that of the "turning points" in the ODMR spectrums output from the third and fourth magnetic sensors 1C and 1D. The narrower the width of the turning point is, the larger the proportionality constant K in the equations (8) and (9) is. The larger the proportionality constant K is, the better the signal-to-noise ratio is. However, as the proportional constant K is increased, signals output from the sensors reach easily maximum values (saturation state). Similar to the sensor 1d according to the fourth embodiment, in the fifth embodiment, when a current flowing through the bus bar 9 is suddenly changed, the sensor 1e measures magnetic fields with following a sudden change in a current flowing through the bus bar 9, by using the third and fourth magnetic sensors 1C and 1D. Specifically, the first magnetic sensor 1A output a first integrating signal indicating the integrated value IXA integrated by the first integrating circuit 23, and a second integrating signal indicating the integrated value IXA integrated by the second integrating circuit 23 to the processor 200 (see FIG. 1, etc.). The second magnetic sensor 1B output a first integrating signal indicating the integrated value IXB integrated by the first integrating circuit 23, and a second integrating signal indicating the integrated value IXB integrated by the second integrating circuit 23 to the processor 200. The processor 200 calculates the absolute value of (IYA−IXA)−(IYB−IXB). The processor 200 determines that a current flowing through the bus bar 9 is suddenly changed, when the calculated value shows a change exceeding a predetermined value within a certain short time, and calculates the magnetic field $B_I$ using the outputs from the third and fourth magnetic sensors 1C and 1D.

Figure 16:
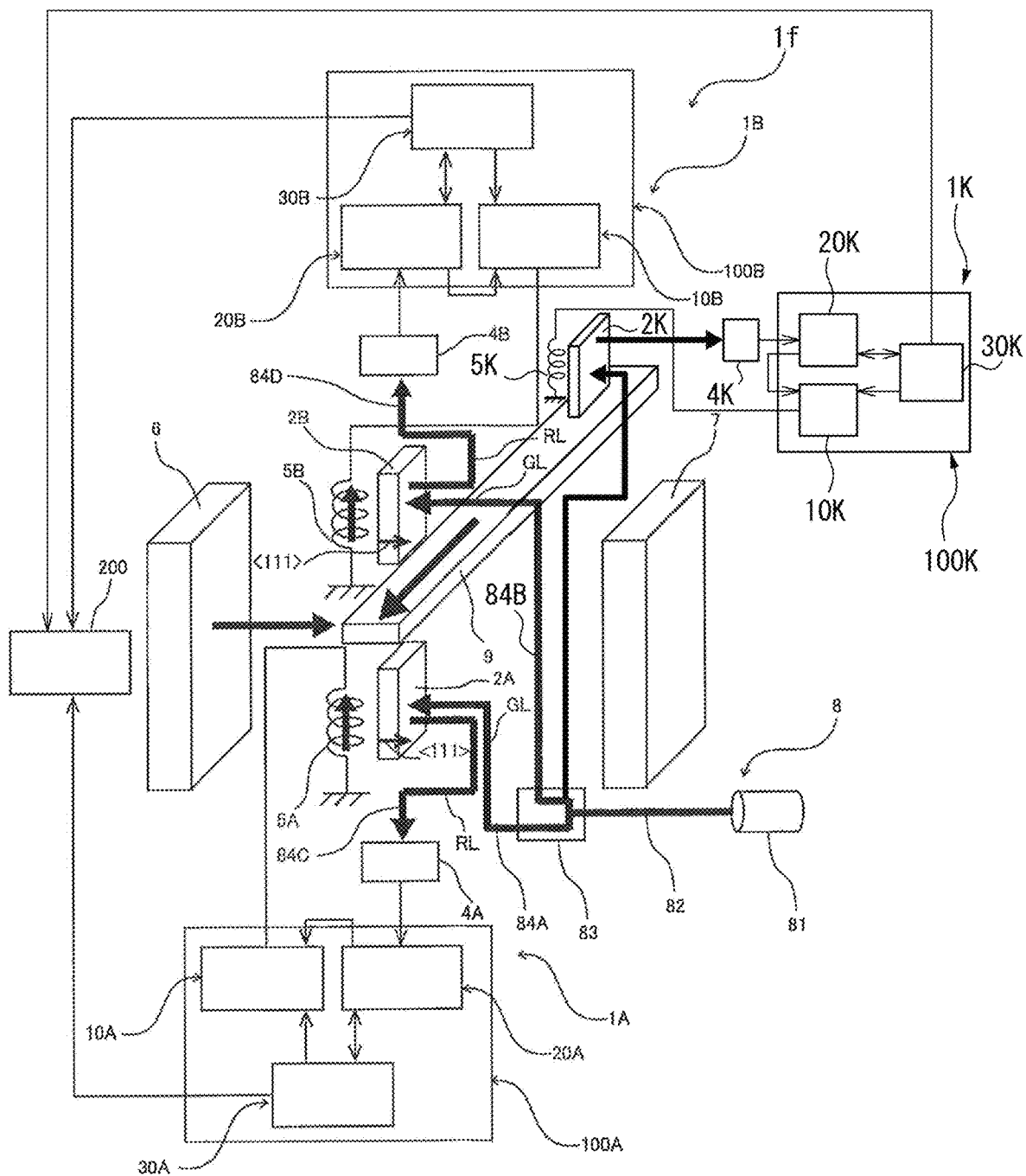
FIG. 16 is a diagram illustrating a sensor according to sixth embodiment of the present disclosure.

FIG. 16 is a diagram illustrating a sensor 1f according to sixth embodiment of the present disclosure. The same reference numerals denote the same configurations as that of the first to fourth embodiments, with reference to the descriptions in the first to fifth embodiments.

Figure 17:
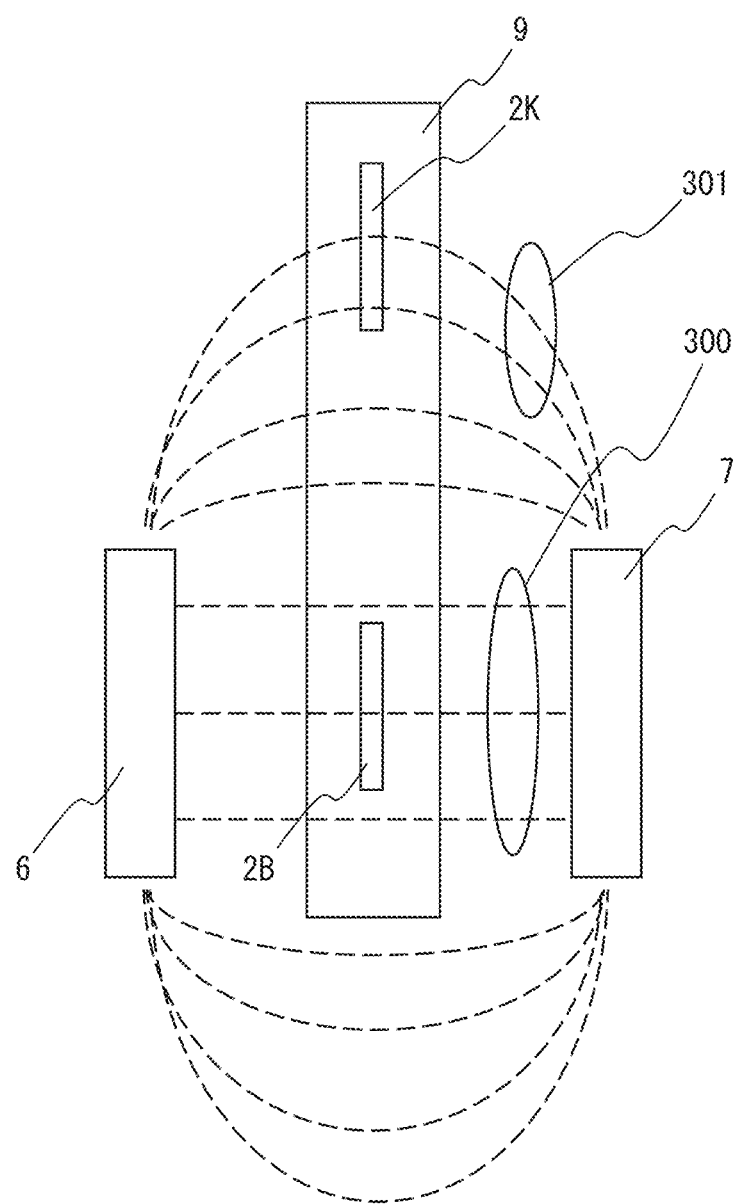
FIG. 17 is a diagram showing a position relationship among a bus bar, first and second magnets and diamond elements shown from the upper surface side of the bus bar in the senor shown in FIG. 16.
Figure 18:
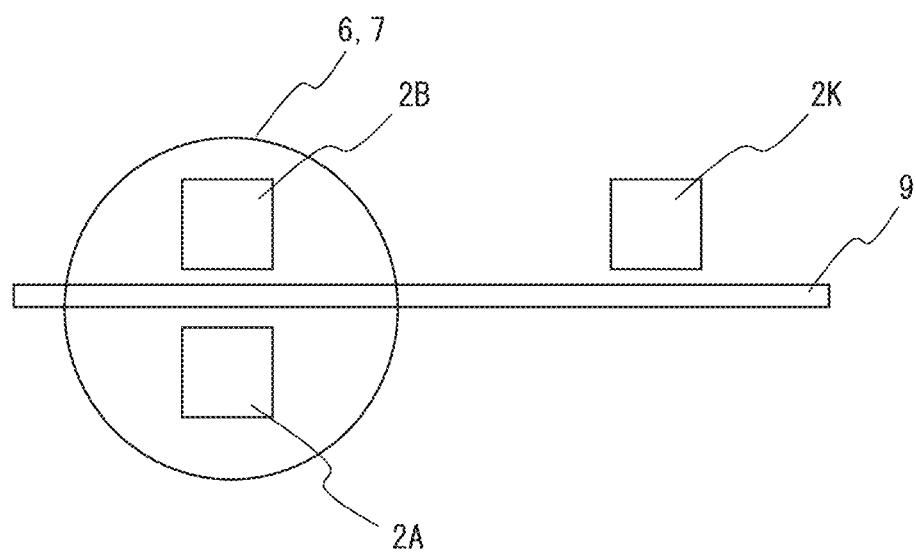
FIG. 18 is a diagram showing a position relationship among a bus bar, first and second magnets and diamond elements shown from a side surface side of the bus bar in the senor shown in FIG. 16.

As shown in FIG. 16, in the sensor if according to sixth embodiment, the diamond element 2B in the second magnetic sensor 1B and a diamond element 2K in a calibration sensor 1K are disposed so as to being apart from each other at a distance in a direction parallel to an extending direction for the bus bar 9. <111> directions in the diamond elements 2A and 2K are parallel. Similar to the sensor 1a shown in FIG. 1, the first and second magnets 6 and 7 apply a static magnetic field parallel to the upper and lower surfaces to the diamond elements 2A and 2K. FIG. 17 is a diagram showing a position relationship among the bus bar 9, the first and second magnets 6 and 7 and the diamond elements 2A and 2K shown from the upper surface side of the bus bar 9. FIG. 18 is a diagram showing a position relationship among the bus bar 9, the first and second magnets 6 and 7 and the diamond elements 2A and 2K shown from a side surface side of the bus bar 9. Since a distance between the diamond element 2K and the first and second magnets 6 and 7 is longer than a distance between the diamond element 2B and the first and second magnets 6 and 7, a magnetic field 301 applied to the diamond element 2K is smaller than a magnetic field 300 applied to the diamond element 2K. At least one of the first and second magnetic sensors 1A and 1B output the first and second magnetic field signals. The calibration sensor 1K is referred to as a third magnetic sensor, includes a sensor 2K, optical sensor 4K an antenna 5K and controller 100K, and detects a magnetic field around the bus bar 9, when excitation light is emitted, and outputting a third magnetic field signal indicating the detected magnetic field. The processor 200 estimates a direction of the magnetic field around the measurement object based on Optically Detected Magnetic Resonance spectrums derived from the first or second magnetic field signals and the third magnetic field signal.

Figure 19:
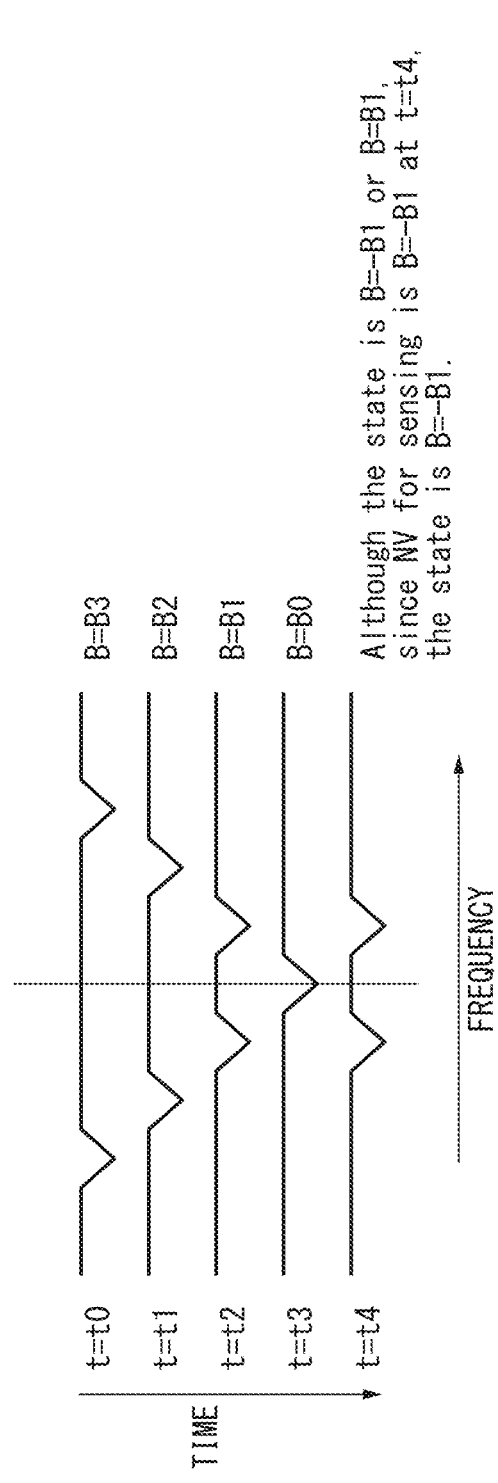
FIG. 19 is a diagram illustrating a relationship between frequencies for peaks in ODMR spectrums and magnetic fields in the diamond elements.
Figure 19:
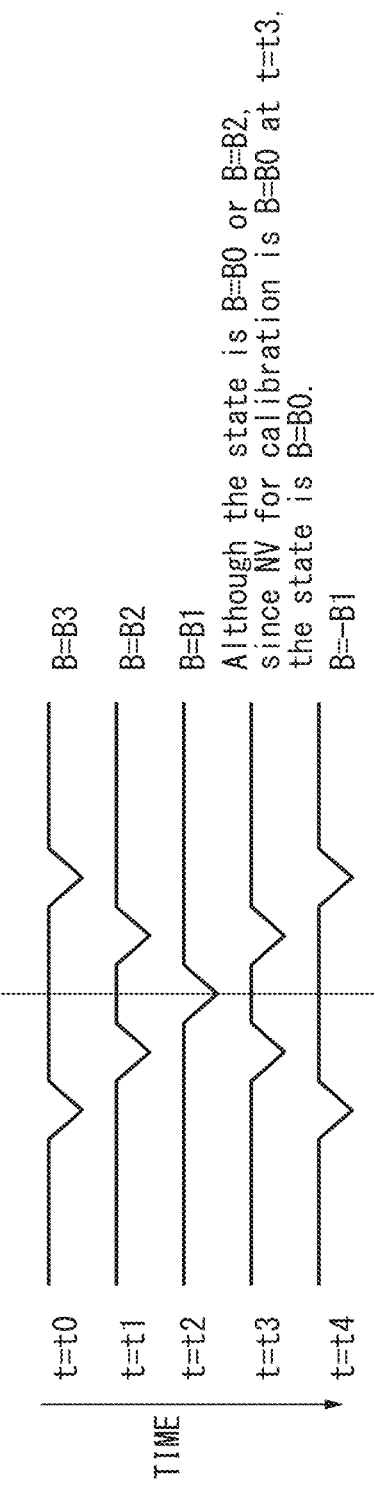

FIG. 19 is a diagram illustrating a relationship between frequencies for peaks in ODMR spectrums and magnetic fields B in the diamond elements 2A and 2K. In FIG. 19 temporal changes of peaks in ODMR spectrums of the diamond elements 2A and 2K are shown. An ODMR spectrum of the diamond element 2A has two peaks at t=t0, has one peak at t=t2, and has two peaks at t=t3. Since the ODMR spectrums of the diamond elements 2A at t=t3 is similar to that of the diamond elements 2A at t=t1, it is unclear whether a magnetic field B around the bus bar 9 is B2 or B0. A distance between two peaks an ODMR spectrum of the diamond element 2K is decreased when time is changed from t=t2 to t=t3, and therefore a magnetic field B around the bus bar 9 at t=t3 is B0 which is smaller than B1 at t=t2. Further, it is clear whether a magnetic field B detected by the diamond element 2K is increased or decrease, by considering as to whether a magnetic field B detected by the diamond element 2A or 2B is increased or decrease.

Although magnetics generating a large static magnetic field are used as the first and second magnets 6 and 7 in the sensors 1a to 1e, the sensor 1f may be detect a magnetic field around the bus bar 9, even if the number of a peak in a ODMR spectrum of the diamond element 2A become one, by applying a large magnetic field applied from the outside of the sensor 1f, and therefore magnetics generating a small static magnetic field, such as coils are used as the first and second magnets 6 and 7 in the sensors 1f.

Figure 20:
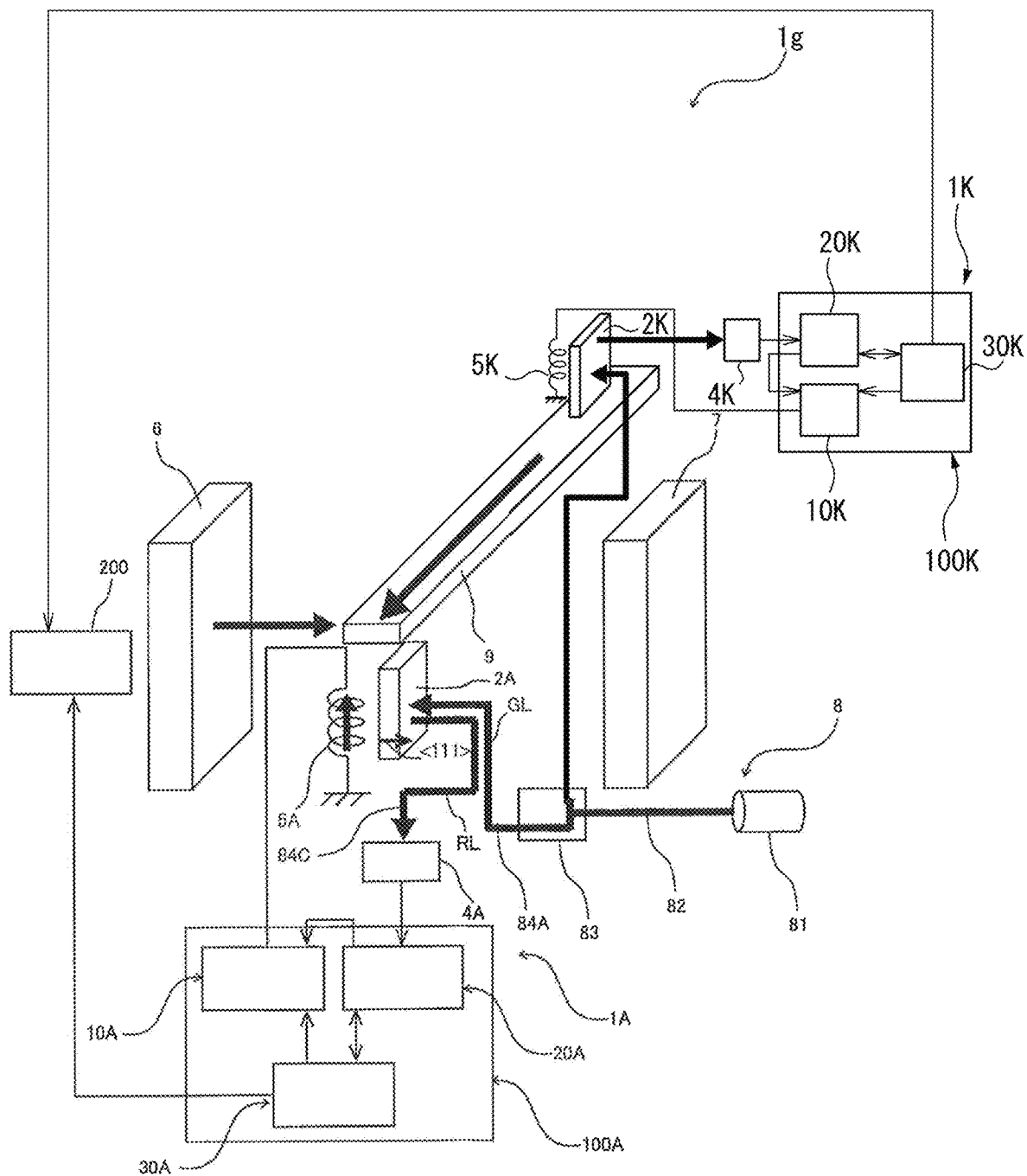
FIG. 20 is a diagram illustrating a sensor according to seventh embodiment of the present disclosure.

FIG. 20 is a diagram illustrating a sensor 1g according to seventh embodiment of the present disclosure. The same reference numerals denote the same configurations as that of the first to fourth embodiments, with reference to the descriptions in the first to sixth embodiments. In the sensor 1g according to seventh embodiment, the calibration sensor 1K is used for detecting a magnetic field around the bus bar 9.

Figure 21:
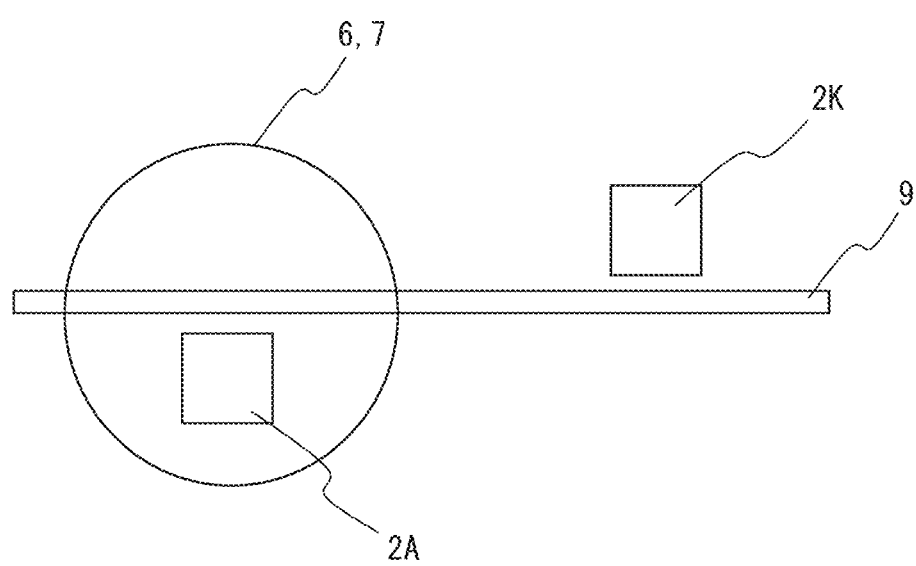
FIG. 21 is a diagram showing a position relationship among a bus bar, first and second magnets and diamond elements shown from a side surface side of the bus bar in the senor shown in FIG. 20.

As shown in FIG. 20, in the sensor 1g according to seventh embodiment, the diamond element 2A in the first magnetic sensor 1A and the diamond element 2K in the calibration sensor 1K are disposed so as to being apart from each other at a distance in a direction parallel to an extending direction for the bus bar 9 across the bus bar 9. The <111> directions in the diamond elements 2A and 2K are parallel. Similar to the sensor 1a shown in FIG. 1, the first and second magnets 6 and 7 apply a static magnetic field parallel to the upper and lower surfaces to the diamond elements 2A and 2K. FIG. 21 is a diagram showing a position relationship among bus bar 9, the first and second magnets 6 and 7 and the diamond elements 2A and 2K shown from a side surface side of the bus bar 9. Since a distance between the diamond element 2K and the first and second magnets 6 and 7 is longer than a distance between the diamond element 2B and the first and second magnets 6 and 7, a magnetic field 301 applied to the diamond element 2K is smaller than a magnetic field 300 applied to the diamond element 2K. The calibration sensor 1K is referred to as a second magnetic sensor, includes a sensor 2K, optical sensor 4K an antenna 5K and controller 100K, and detects a magnetic field around the bus bar 9, when excitation light is emitted, and outputting a second magnetic field signal indicating the detected magnetic field. The processor 200 estimates a direction of the magnetic field around the measurement object based Optically Detected Magnetic Resonance spectrums derived from the first and second magnetic field signals.

A magnetic field $B_A$ detected by the first magnetic sensor 1A is indicated by equation (19), and a magnetic field $B_K$ detected by calibration first magnetic sensor 1K is indicated by equation (20).

$$B_A = B_I \pm B_O \tag{19}$$

$$B_K = -B_I + B_C + B_O \tag{20}$$

$B_I$ is a magnetic field generated by a current flowing through the bus bar 9, $B_C$ is an offset between magnetic fields detected by the diamond elements 2A and 2K, and $B_O$ is an external magnetic field.

The external magnetic field $B_O$ is eliminated by calculating a difference between magnetic fields $B_A$ and $B_K$. The processor 200 calculates a difference between the magnetic field $B_A$ detected by the first magnetic sensor 1A and the magnetic field $B_K$ detected by the calibration magnetic sensor 1K to eliminate the external magnetic field $B_O$ in order to calculate the magnetic field $B_I$ represented by the following equation (21).

$$B_I = (\text{magnetic field } B_A - \text{magnetic field } B_K)/2 + \text{magnetic field } B_C/2 \tag{21}$$

Since the magnetic field $B_C/2$ which is a second member in the right side of the equation (21) is a constant value, the processor 200 may calculate $B_I = (\text{magnetic field } B_A - \text{magnetic field } B_K)/2$ which is a first member in the right side of the equation (21), by subtracting the magnetic field $B_C/2$ from the right side of the equation (21).

Similar to the sensor 1f, the sensor 1g may be detect a magnetic field around the bus bar 9, even if the number of a peak in a ODMR spectrum of the diamond element 2A become one, by applying a large magnetic field applied from the outside of the sensor 1f, and therefore magnetics generating a small static magnetic field, such as coils are used as the first and second magnets 6 and 7 in the sensors 1g.

Although the present invention has been described based on the embodiments, the present invention is not limited to the above embodiment, invention may be modified, and known or well-known techniques may be appropriately combined as long as the combined techniques do not deviate from a scope of the present invention.

For example, although in the present embodiments, the element having color centers of the excitation target is a diamond element having NV centers, the element may be other element such as a diamond element having SnV color centers consisting of tin (Sn) and a hole, diamond element having Siv color centers consisting of silicon (Si) and a hole, or diamond element having GeV color centers consisting of germanium (Ge) and a hole.

What is claimed is:

1. A sensor comprising:
   a first magnetic sensor configured to detect a magnetic field around a measurement object when excitation light is emitted, and output at least one of a first magnetic field signal indicating the detected magnetic field and a first temperature signal indicating a temperature around the measurement object;
   a second magnetic sensor configured to detect a magnetic field around a measurement object when excitation light is emitted, and output at least one of a second magnetic field signal indicating the detected magnetic field and a second temperature signal indicating a temperature around the measurement object;
   an optical system configured to emit the excitation light to the first and second magnetic sensors; and
   a processor configured to calculate a difference between the magnetic field corresponding to the first magnetic field signal and the magnetic field corresponding to the second magnetic field signal, wherein each of the first and second magnetic sensors comprises:
   an element disposed around the measurement object and having color centers;
   an antenna configured to radiate a microwave magnetic field to the element;
   an optical sensor configured to detect an intensity of a fluorescence generated by the element, and outputting an intensity signal indicating the detected intensity; and
   a controller configured to generate a microwave output to the antenna based on the intensity signal, calculate at least one of a magnetic field and temperature around the measurement object, and output at least one of a magnetic field signal indicating the calculated magnetic field and a temperature signal indicating the calculated temperature to the processor.

2. The sensor according to claim 1, wherein the elements in the first and second magnetic sensors are disposed to face each other across the measurement object.

3. The sensor according to claim 2, further comprising:
   a third magnetic sensor including an element, antenna, optical sensor and controller, and configured to detect a magnetic field around the measurement object when excitation light is emitted, and output at least one of a third magnetic field signal indicating the detected magnetic field and a third temperature signal indicating a temperature around the measurement object; and a fourth magnetic sensor including an element, antenna, optical sensor and controller, and configured to detect a magnetic field around the measurement object when excitation light is emitted, and output at least one of a fourth magnetic field signal indicating the detected magnetic field and a fourth temperature signal indicating a temperature around the measurement object, wherein the optical system further emits the excitation light to the third and the fourth magnetic sensors, the processor further calculates a difference between the magnetic field corresponding to the third magnetic field signal and the magnetic field corresponding to the fourth magnetic field signal, and the elements in the third and fourth magnetic sensors are disposed so as to face each other across the measurement object in a direction perpendicular to a facing direction between the elements in the first and second magnetic sensors.

4. The sensor according to claim 2, further comprising:
a third magnetic sensor including an element, antenna, optical sensor and controller, and configured to detect a magnetic field around the measurement object when excitation light is emitted, and output at least one of a third magnetic field signal indicating the detected magnetic field and a third temperature signal indicating a temperature around the measurement object; and
a fourth magnetic sensor including an element, antenna, optical sensor and controller, and configured to detect a magnetic field around the measurement object when excitation light is emitted, and output at least one of a fourth magnetic field signal indicating the detected magnetic field and a fourth temperature signal indicating a temperature around the measurement object, wherein the measurement object is a current line,
the optical system further emits the excitation light to the third and the fourth magnetic sensors,
the processor further calculates a difference between the magnetic field corresponding to the third magnetic field signal and the magnetic field corresponding to the fourth magnetic field signal, when the processor determines that a rapid change in a current flowing through the current line appears, and
the elements in the third and fourth magnetic sensors are disposed so as to face each other across the current line and elements in the first and second magnetic sensors in a direction parallel to a facing direction between the elements in the first and second magnetic sensors.

5. The sensor according to claim 2, further comprising:
a third magnetic sensor including an element, antenna, optical sensor and controller, and configured to detect a magnetic field around the measurement object when excitation light is emitted, and output at least one of a third magnetic field signal indicating the detected magnetic field and a third temperature signal indicating a temperature around the measurement object; and
a fourth magnetic sensor including an element, antenna, optical sensor and controller, and configured to detect a magnetic field around the measurement object when excitation light is emitted, and output at least one of a fourth magnetic field signal indicating the detected magnetic field and a fourth temperature signal indicating a temperature around the measurement object, wherein the measurement object is a current line,
the optical system further emits the excitation light to the third and the fourth magnetic sensors,
the processor further calculates a difference between the magnetic field corresponding to the third magnetic field signal and the magnetic field corresponding to the fourth magnetic field signal, when the processor determines that a rapid change in a current flowing through the current line appears, and
the elements in the first and third magnetic sensors are disposed side by side, so that a distance between the element in the first magnetic sensor and the current line is equal to a distance between the element in the third magnetic sensor and the current line,
the elements in the second and fourth magnetic sensors are disposed side by side, so that a distance between the element in the second magnetic sensor and the current line is equal to a distance between the element in the fourth magnetic sensor and the current line, and
widths of turning points in the Optically Detected Magnetic Resonance spectrums output from the first and second magnetic sensors are narrower than widths of turning points in the Optically Detected Magnetic Resonance spectrums output from the third and fourth magnetic sensors.

6. The sensor according to claim 1, wherein the controller includes
a first microwave oscillator configured to output a first microwave modulated at a first phase in a predetermined modulation frequency,
a second microwave oscillator configured to output a second microwave modulated at a second phase different from the first phase in the modulation frequency,
a switch configured to switch between a first connection state in which the antenna is connected with the first microwave oscillator and a second state in which the antenna is connected with the second microwave oscillator,
a lock-in amplifier configured to output first output signals at the first phase, and output second output signals at the second phase,
a first integrating circuit configured to generate a first integrating signal integrating the first output signals output from the lock-in amplifier,
a second integrating circuit configured to generate a second integrating signal integrating the second output signals output from the lock-in amplifier, and
a magnetic field and temperature calculator configured to calculate at least one of a magnetic field and temperature based on the first integrating signal and second integrating signal, wherein
the first microwave oscillator feedback controls a frequency of the first microwave based on the first integrating signal, and
the second microwave oscillator feedback controls a frequency of the second microwave based on the second integrating signal.

7. The sensor according to claim 6, wherein
the first phase is 90° different from the second phase,
a frequency of a switching signal for switching between the first and second states by the switch is twice larger than the modulation frequency, and
rising and falling phases in the switching signal are 45° different from rising and falling phases in a modulated signal input to the first and second microwave oscillators.

8. The sensor according to claim 1, further comprising a pair of magnets configured to apply a static magnetic field around the first and second magnetic sensors, wherein
- the pair of magnets generates the static magnetic field in a direction perpendicular to a facing direction between the elements in the first and second magnetic sensors.

9. The sensor according to claim 8, further comprising a third magnetic sensor including an element, antenna, optical sensor and controller, and configured to detect a magnetic field around the measurement object when excitation light is emitted, and output a third magnetic field signal indicating the detected magnetic field, wherein
- the optical system further emits the excitation light to the third magnetic sensor,
- at least one of the first and second magnetic sensors output the first and second magnetic field signals,
- the elements in the second and third magnetic sensors are disposed side by side, so that a distance between the element in the third magnetic sensor and the pair of magnets is longer than a distance between the element in the second magnetic sensor and the pair of magnets, and
- the processor estimates a direction of the magnetic field around the measurement object based on Optically Detected Magnetic Resonance spectrums derived from the first or second magnetic field signals and the third magnetic field signal.

10. The sensor according to claim 8, wherein
- the element in the second magnetic sensor is disposed, so that a distance between the element in the second magnetic sensor and the pair of magnets is longer than a distance between the element in the first magnetic sensor and the pair of magnets,
- the first and second magnetic sensors output the first and second magnetic field signals,
- the processor estimates a direction of the magnetic field around the measurement object based on Optically Detected Magnetic Resonance spectrums derived from the first and second magnetic field signals.

11. The sensor according to claim 1, wherein the optical system includes
- a light source configured to emit an excitation light, and
- a pair of light guiding paths configured to guide the excitation light to each of the elements in the first and second magnetic sensors.

12. The sensor according to claim 1, wherein the color centers are NV centers, and
- the antenna emits the microwave magnetic field in a direction perpendicular to the NV centers.

* * * * *